(12) United States Patent
Sasagawa

(10) Patent No.: US 7,853,844 B2
(45) Date of Patent: Dec. 14, 2010

(54) SEMICONDUCTOR INTEGRATED CIRCUIT SYSTEM, SEMICONDUCTOR INTEGRATED CIRCUIT, OPERATING SYSTEM, AND CONTROL METHOD FOR SEMICONDUCTOR INTEGRATED CIRCUIT

(75) Inventor: Yukihiro Sasagawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 802 days.

(21) Appl. No.: 11/785,293

(22) Filed: Apr. 17, 2007

(65) Prior Publication Data
US 2007/0255992 A1 Nov. 1, 2007

(30) Foreign Application Priority Data

Apr. 18, 2006 (JP) ............................. 2006-114814
Mar. 7, 2007 (JP) ............................. 2007-057388

(51) Int. Cl.
*G01R 31/28* (2006.01)
*G06F 11/00* (2006.01)

(52) U.S. Cl. ................. 714/724; 714/731; 714/742; 714/817; 714/25

(58) Field of Classification Search ............. 714/724, 714/731, 742, 817, 25
See application file for complete search history.

(56) References Cited

U.S. PATENT DOCUMENTS

| | | | |
|---|---|---|---|
| 5,446,748 A * | 8/1995 | Hasebe et al. ............... | 714/814 |
| 6,456,560 B2 * | 9/2002 | Arimoto et al. ......... | 365/233.14 |
| 6,715,096 B2 * | 3/2004 | Kuge ......................... | 713/600 |
| 6,934,884 B1 | 8/2005 | Wakabayashi et al. | |
| 7,089,133 B1 | 8/2006 | Williams et al. | |
| 7,139,952 B2 * | 11/2006 | Matsumoto et al. ......... | 714/726 |
| 7,320,091 B2 * | 1/2008 | Blaauw et al. ............... | 714/30 |
| 2004/0153902 A1 | 8/2004 | Machado et al. | |
| 2004/0181718 A1 | 9/2004 | Long | |
| 2004/0199821 A1 * | 10/2004 | Flautner et al. ............... | 714/30 |

FOREIGN PATENT DOCUMENTS

| JP | 9-305649 | 11/1997 |
|---|---|---|
| JP | 2001-156261 | 6/2001 |

OTHER PUBLICATIONS

Knight et al., An IDDQ Sensor for Concurrent Timing Error Detection, Oct. 1998, IEEE, vol. 33, No. 10, pp. 1545-1550.*
Li et al., A Unified Approach to Detecting Crosstalk Faults of Interconnects in Deep Sub-micron VLSI, 2004, IEEE, pp. 1-6.*
Das, et al., "A Self-Tuning DVS Processor Using Delay-Error Detection and Correction", 2005 Symposium on VLSI Circuits Digest of Technical Papers, Jun. 16, 2005, pp. 258-261.

* cited by examiner

*Primary Examiner*—John J Tabone, Jr.
(74) *Attorney, Agent, or Firm*—McDermott Will & Emery LLP

(57) ABSTRACT

A semiconductor integrated circuit system has a control target circuit executing a program, a system information monitor unit for outputting system information indicating a state of the control target circuit, a circuit characteristic monitor unit for determining a circuit characteristic of the control target circuit and outputting the circuit characteristic as circuit characteristic information, a malfunction determination unit for determining whether or not the control target circuit is normally operating based on the system information, a reference circuit characteristic holding unit for holding the circuit characteristic information as reference circuit characteristic information when the control target circuit is normally operating, a malfunction factor determination unit for determining a malfunction factor based on the circuit characteristic information and on the reference circuit characteristic information when the control target circuit is not normally operating, and a correction target determination unit for determining a correction target in the control target circuit.

30 Claims, 20 Drawing Sheets

DURING NORMAL OPERATION

DURING ABNORMAL OPERATION

SEMICONDUCTOR INTEGRATED CIRCUIT SYSTEM, SEMICONDUCTOR INTEGRATED CIRCUIT, OPERATING SYSTEM, AND CONTROL METHOD FOR SEMICONDUCTOR INTEGRATED CIRCUIT

CROSS REFERENCE TO RELATED APPLICATIONS

The teachings of Japanese Patent Applications JP 2006-114814, filed Apr. 18, 2006, and JP 2007-57388, filed Mar. 7, 2007, are entirely incorporated herein by reference, inclusive of the claims, specifications, and drawings.

BACKGROUND OF THE INVENTION

The present invention relates to a semiconductor integrated circuit and, more particularly, to a technology for preventing the malfunction of a semiconductor integrated circuit resulting from a change in the electrical characteristics thereof.

In designing a semiconductor integrated circuit, a so-called signal integrity (SI) verification is performed which verifies and guarantees that a malfunction due to noise does not occur by performing simulation (see Japanese Laid-Open Patent Publication No. 9-305649). On the other hand, a noise margin improvement method based on the control of a substrate voltage has been proposed. In this case, to implement a constant threshold voltage or saturation current irrespective of a temperature condition and process conditions, the substrate voltage is determined by performing feedback control using a reference circuit (see Japanese Laid-Open Patent Publication No. 2001-156261).

There has also been proposed a method which uses a flip-flop for detecting the occurrence of a set-up error on a specified path and performs feedback control to increase a power supply voltage when a set-up error is detected (see "A Self-Tuning DVS Processor Using Delay-Error Detection and Correction" by Das, S. et al., 2005 Symposium on VLSI Circuits Digest of Technical Papers, IEEE, Jun. 16, 2005, pp. 258-261).

When feedback control is thus performed, it is assumed that each of a reference value and a feedback function is uniquely determined. For example, for the control of a substrate voltage, a reference voltage is generated by using a band gap reference circuit utilizing the fact that the band gap of a semiconductor is fixed as a physical constant. In relation to the feedback function, it has been performed that, e.g., the relationship between the substrate voltage and a threshold voltage or between the substrate voltage and a saturation current is implemented with an analog circuit or the relationship between a power supply voltage and a set-up error is implemented with critical paths and a set-up error detection flip-flop.

However, in the case of guaranteeing that no malfunction occurs by simulation, it is necessary to guarantee that "a malfunction does not occur" in such a manner as, for example, "there is totally no problem" or "there is statistically no problem when a time period of a given length is considered". This leads to the addition of an excessive margin and thereby causes the degradation of the performance of a circuit.

A problem associated with signal integrity is caused not only by transistor characteristics but also by mutual influencing characteristics such as a wire-to-wire capacitance and the relative relationship between driving abilities. This causes the problem that it is difficult to produce a reference value for a capacitance, a reference value for the relative relationship between driving abilities, or the like or it is difficult to perform adaptive control in response to a use situation because the feedback function cannot be uniquely determined. Additionally, in the case of performing correction in consideration of signal integrity, it is necessary to perform correction not only to the transistor characteristics but also to variations in wire-to-wire capacitance. However, although the control of the substrate voltage allows the correction of the transistor characteristics, it is impossible to correct the variations in wire-to-wire capacitance only with simple substrate voltage control.

Moreover, it has become increasingly difficult to predict the state of a circuit as the miniaturization of the circuit proceeds so that the influence of problems as mentioned above has become greater.

SUMMARY OF THE INVENTION

It is therefore an object of the present invention to enhance the performance of a semiconductor integrated circuit by removing an excessive margin.

A semiconductor integrated circuit system according to the present invention is constructed to determine, when the operation of a program being executed in a circuit as a control target is not normal, a factor causing the malfunction and control the control target circuit based on the result of the determination.

The arrangement constantly holds the operation of the program normal so that it is unnecessary to give an excessive margin in designing the circuit. As a result, it is possible to enhance the basic performance of the semiconductor integrated circuit.

Specifically, a semiconductor integrated circuit system according to one aspect of the present invention comprises: a control target circuit executing a program; a system information monitor unit for outputting system information indicating a state of the control target circuit; a circuit characteristic monitor unit for determining a circuit characteristic of the control target circuit and outputting the circuit characteristic as circuit characteristic information; a malfunction determination unit for determining whether or not the control target circuit is normally operating based on the system information; a reference circuit characteristic holding unit for holding the circuit characteristic information as reference circuit characteristic information when the control target circuit is normally operating; a malfunction factor determination unit for determining a malfunction factor based on the circuit characteristic information determined by the circuit characteristic monitor unit and on the reference circuit characteristic information when the control target circuit is not normally operating; a correction target determination unit for determining a correction target in the control target circuit based on the malfunction factor, generating objective electrical characteristic information for the correction target, and outputting the objective electrical characteristic information; and an electrical characteristic control unit for controlling the control target circuit in accordance with the objective electrical characteristic information.

The arrangement allows adaptive control to be performed with respect to the control target circuit and the operation of the program to be held normal. A circuit characteristic serving as a reference can be easily acquired, even though it is difficult to predetermine a reference value for the circuit characteristic. As a result, the malfunction factor can be flexibly determined. Since the system information is used, a feedback according to a use situation can be implemented.

A semiconductor integrated circuit system according to another aspect of the present invention comprises: a control target circuit having a register; and an electrical characteristic control unit for supplying a clock signal to the control target circuit, wherein the register detects a set-up error in the control target circuit and the electrical characteristic control unit extends a period of the clock signal when the register detects a set-up error.

In the arrangement, when a set-up error is detected, the period of the clock signal is extended and therefore the clock signal at a high frequency can be used. This allows the operation of the control target circuit to be performed at a higher speed.

A semiconductor integrated circuit according to the present invention comprises: a plurality of logic circuits; a metal wire providing connection between the plurality of logic circuits; a dummy metal disposed in proximity to the metal wire; and a ferroelectric material disposed over or under the dummy metal.

An operating system according to the present invention is an operating system operating on a semiconductor integrated circuit, the operating system having: a software layer for linking a program to the operating system, wherein the software layer is a function in which information indicating a state of execution of the program is defined as an argument.

A control method for a semiconductor integrated circuit according to one aspect of the present invention is a control method for a semiconductor integrated circuit which controls a control target circuit in the semiconductor integrated circuit, the control method comprising: a malfunction determination step of determining whether or not the control target circuit is normally operating based on system information indicating a state of the control target circuit executing a program; a reference circuit characteristic holding step of holding circuit characteristic information on the control target circuit as reference circuit characteristic information when the control target circuit is normally operating; a malfunction factor determination step of determining a malfunction factor based on the circuit characteristic information on the control target circuit and on the reference circuit characteristic information when the control target circuit is not normally operating; a correction target determination step of determining a correction target in the control target circuit based on the malfunction factor; and a correction step of generating objective electrical characteristic information for the correction target.

A control method for a semiconductor integrated circuit according to another aspect of the present invention is a control method for a semiconductor integrated circuit which controls a control target circuit in the semiconductor integrated circuit, the control method comprising: a detection step of detecting a set-up error in the control target circuit; and a control step of extending a period of a clock signal supplied to the control target circuit when a set-up error is detected in the detection step.

Since the present invention allows adaptive correction control and the removal of an excessive margin, the performance of the semiconductor integrated circuit can be improved.

DETAILED DESCRIPTION OF THE INVENTION

Figure 1:
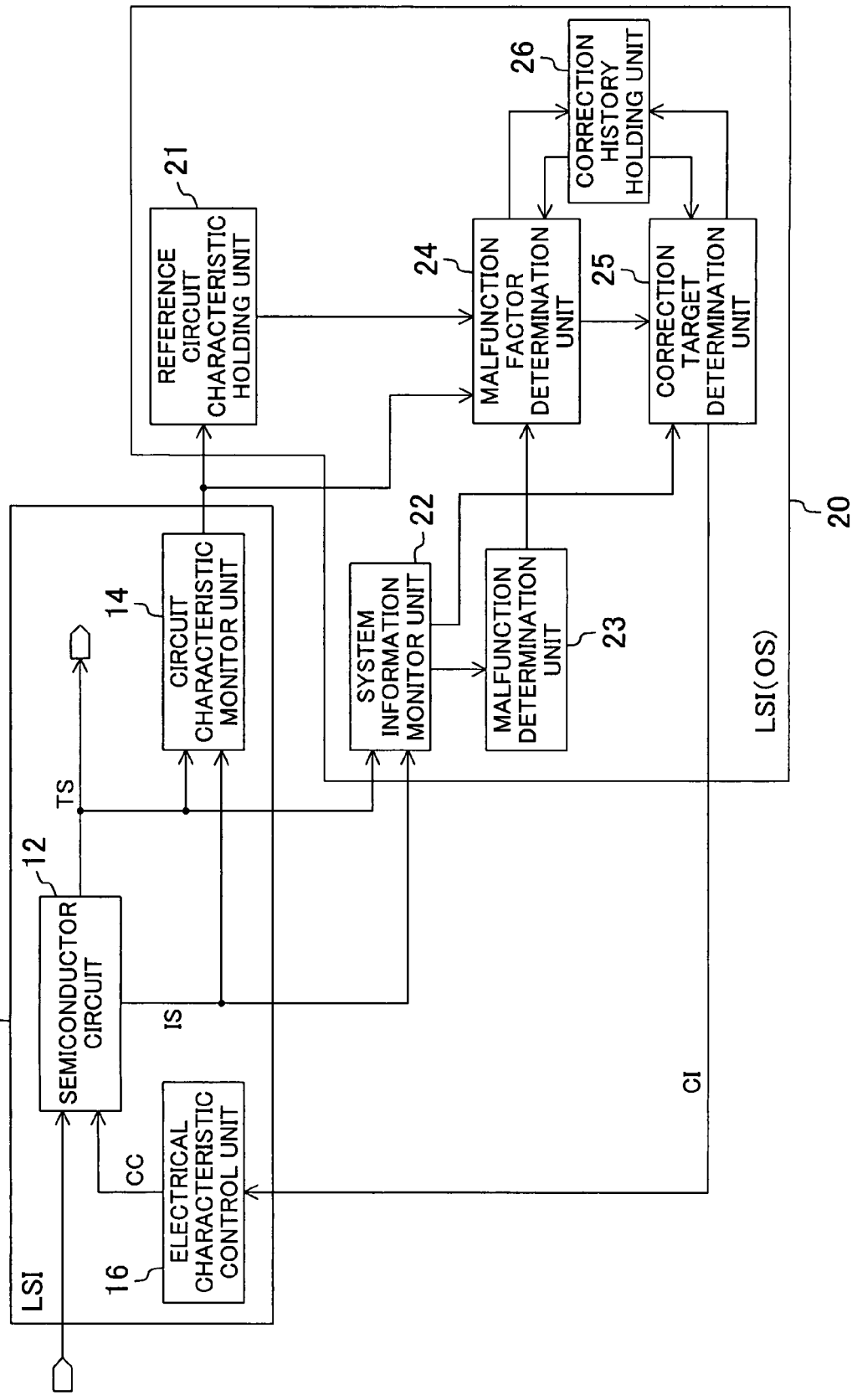
FIG. 1 is a block diagram showing a structure of a semiconductor integrated circuit system according to an embodiment of the present invention.

Referring to the drawings, an embodiment of the present invention will be described herein below.

FIG. 1 is a block diagram showing a structure of a semiconductor integrated circuit system according to the embodiment of the present invention. The system of FIG. 1 comprises semiconductor integrated circuits (LSIs) 10 and 20. The LSI 10 has a semiconductor circuit 12 as a control target circuit, a circuit characteristic monitor unit 14, and an electrical characteristic control unit 16. The LSI 20 comprises a reference circuit characteristic holding unit 21, a system information monitor unit 22, a malfunction determination unit 23, a malfunction factor determination unit 24, a correction target determination unit 25, and a correction history holding unit 26.

The LSIs 10 and 20 may be constructed as different chips or as a single chip. The LSI 20 implements the function of each of the components by means of an operating system (OS) executed on the circuit hereof. The OS may also be executed on the semiconductor circuit 12.

The semiconductor circuit 12 has, e.g., a transistor, wiring, a capacitance, a power supply circuit, a register, and the like and executes an application program or the like. The semiconductor circuit 12 outputs the internal signal IS thereof and the output signals TS and SS thereof to the circuit characteristic monitor unit 14 and the system information monitor unit 22. The circuit characteristic monitor unit 14 generates circuit characteristic information based on the internal signal IS, the output signal TS, and the like and outputs the circuit characteristic information to the reference circuit characteristic holding unit 21 and the malfunction factor determination unit 24. The system information monitor unit 22 outputs system information indicating the operating state of the semiconductor circuit 12 to the malfunction determination unit 23 and the correction target determination unit 25 based on the signals from the semiconductor circuit 12.

Figure 2:
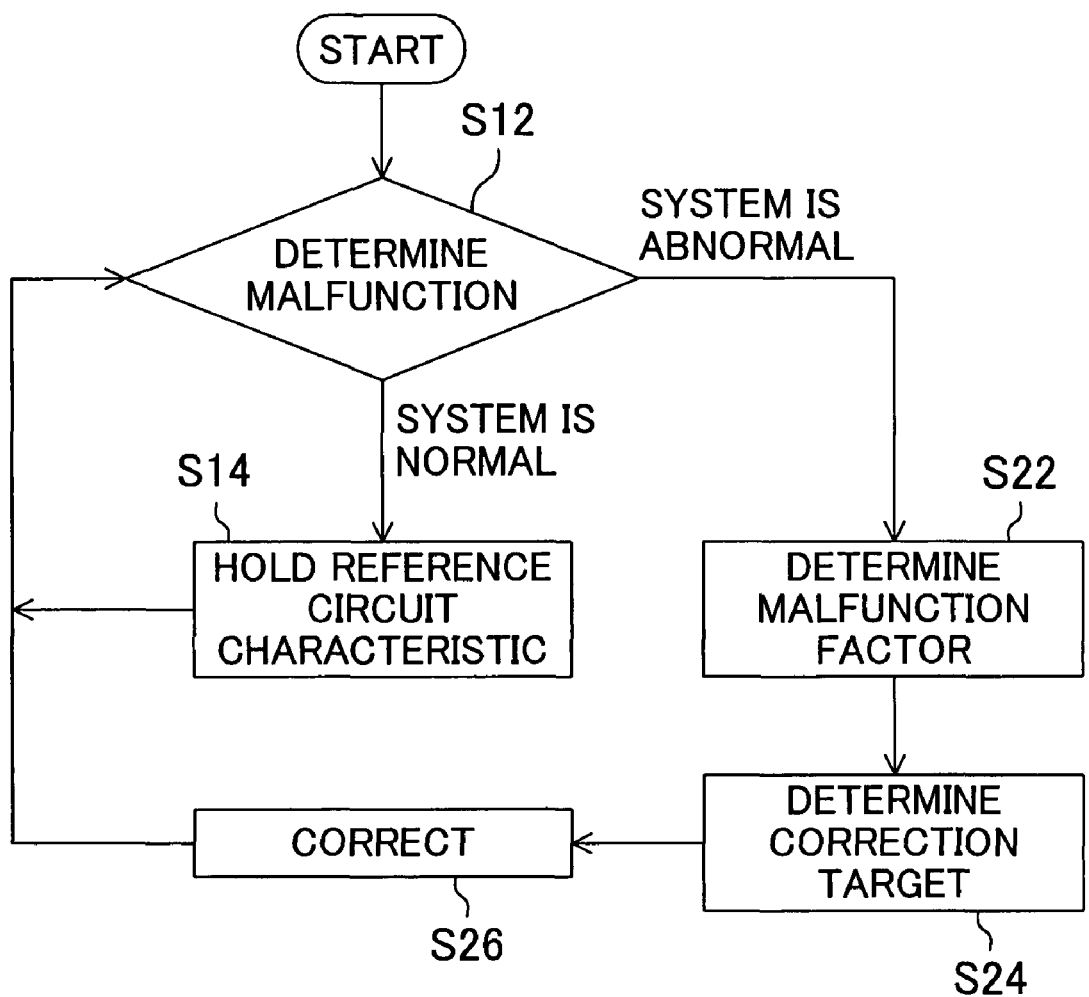
FIG. 2 is a flow chart showing the flow of a process in the semiconductor integrated circuit system of FIG. 1.

FIG. 2 is a flow chart showing the flow of a process in the semiconductor integrated circuit system of FIG. 1. The flow chart of FIG. 2 comprises a malfunction determination step S12, a reference circuit characteristic holding step S14, a malfunction factor determination step S22, a correction target determination step S24, and a correction step S26.

In the malfunction determination step S12, the malfunction determination unit 23 determines whether the system is normal or abnormal based on the system information obtained from the system information monitor unit 22. When the semiconductor circuit 12 is normally operating (the system is normal), the process flow advances to the reference circuit characteristic holding step S14. When the semiconductor circuit 12 is not normally operating (the system is abnormal), the process flow advances to the malfunction factor determination step S22.

In the reference circuit characteristic holding step S12, the reference circuit characteristic holding unit 21 holds the circuit characteristic information received from the circuit characteristic monitor unit 14 as reference circuit characteristic information and returns to the step S12. In this step, a circuit characteristic serving as a reference can be easily acquired even though the circuit characteristic is, e.g., a capacitance, the relative relationship between driving abilities, or the like and it is difficult to predetermine a reference value for the circuit characteristic.

In the malfunction factor determination step S22, the malfunction factor determination unit 24 compares the circuit characteristic information received from the circuit characteristic monitor unit 14 with the reference circuit characteristic information held in the reference circuit characteristic holding unit 21. When the circuit characteristic information is different from the reference circuit characteristic information, the malfunction factor determination unit 24 determines a factor (malfunction factor) causing the difference. The malfunction factor determination unit 24 performs the determination in accordance with, e.g., any of the following procedures (A1) to (A4). Signals A and B are the internal signals of the semiconductor circuit 12.

(A1) When the glitch of the signal A is higher than that as a reference circuit characteristic and the slew time of a signal A is larger than that as a reference circuit characteristic, the malfunction factor determination unit 24 determines that a reduction in the driving ability of a transistor outputting the signal A is the malfunction factor. The slew time used herein is a time required for a shift in the voltage level of the signal A.

(A2) When the glitch of the signal A is higher than that as the reference circuit characteristic and the slew time of the signal A is smaller than that as the reference circuit characteristic, the malfunction factor determination unit 24 determines that an increase in the driving ability of the transistor outputting the signal A is the malfunction factor.

(A3) When the glitch of the signal A or the signal B is higher than that as the reference circuit characteristic and the magnitude relationship between the respective slew times of the signals A and B is inverse to that as a reference circuit characteristic, the malfunction factor determination unit 24 determines that the inverted order relationship between the respective driving abilities of the transistors outputting the signals A and B is the malfunction factor.

(A4) When the glitch of the signal A or the signal B is higher than that as the reference circuit characteristic and the slew time of each of the signals A and B is the same as that as the reference circuit characteristic, the malfunction factor determination unit 24 determines that an increase in the wire-to-wire capacitance (coupling capacitance) between respective wires transmitting the signals A and B is the malfunction factor.

In the correction target determination step S24, the correction target determination unit 25 acquires the system information and correction history information from the system information monitor unit 22 and the correction history holding unit 26, respectively, and determines a correction target in the semiconductor circuit 12 which is effective in preventing the occurrence of the malfunction based on the malfunction factor determined by the malfunction factor determination unit 24. In the correction history holding unit 26, the correction history information on previously performed correction is stored. The correction history holding unit 26 also stores information on new correction. When the correction history information is used, the correction target determination unit 25 performs a search to determine the target of correction and determines the correction target in accordance with either of, e.g., the following procedures (B1) and (B2).

(B1) When it has been recorded in the correction history that the ability to drive the signal A has decreased and correction for increasing the ability to drive the signal A has been performed, it can be estimated that the sufficient correction effect is not obtainable due to the deterioration of the drive transistor outputting the signal A or the like. Therefore, for the purpose of bringing the magnitude relationship between the respective slew times of the signals A and B closer to that as the reference circuit characteristic, the correction target determination unit 25 determines correction for reducing the ability to drive the signal B as a correction target.

(B2) When it has been recorded in the correction history that the ability to drive the signal A has decreased and correction for increasing the driving ability of the transistor positioned in proximity to the drive transistor for the signal A has been performed, it can be estimated that characteristic fluctuations have occurred within the chip and transistor characteristics in the vicinity of the drive transistor outputting the signal A have deteriorated. Therefore, the correction target determination unit 25 determines correction for increasing the driving ability of the drive transistor outputting the signal A as a correction target.

In the correction step S26, the correction target determination unit 25 generates an objective electrical characteristic information CI for the determined correction target and outputs the objective electrical characteristic information CI to the electrical characteristic control unit 16. The electrical characteristic control unit 16 generates an electrical characteristic control signal CC in accordance with the objective electrical characteristic information CI and outputs the electrical characteristic control signal CC to the semiconductor circuit 12 to control the circuit characteristics of the semiconductor circuit 12. Thereafter, the process flow returns to the step S12.

A description will be given herein below to a specific example of each of the components of the semiconductor integrated circuit system of FIG. 1.

Examples of the system information and examples of the determination of whether or not the system is normal in the malfunction determination step S12 in FIG. 2 are shown below in accordance with the following procedures (C1) to (C5).

(C1) The behavior of the system in an operation sequence is used as the viewpoint. The system information monitor unit 22 outputs the state of the semiconductor circuit 12 as the system information. A time (check point) at which the state is checked is determined in advance and, when the state of the semiconductor circuit 12 is as expected at the check point, the malfunction determination unit 23 determines that the semiconductor circuit 12 is normally operating. In the other cases, the malfunction determination unit 23 determines that the semiconductor circuit 12 is not normally operating. Since the procedure can be implemented by referencing the counter and the register, it can be implemented by making a minimum resource investment.

(C2) The behavior of the system that an error recovery operation such as an overflow or an interpolation process frequently occurs due to an arithmetic operation result which is no more normal is used as the viewpoint. The semiconductor circuit 12 executes, e.g., a visual/audio processing program and the system information monitor unit 22 outputs information indicating that an error recovery routine in the program has been called as the system information. A reference for the number of calls is determined in advance and, when calls are made a predetermined number of times or more, the malfunction determination unit 23 determines that the semiconductor circuit 12 is not normally operating. In the other cases, the malfunction determination unit 23 determines that the semiconductor circuit 12 is normally operating. Since the procedure uses a part of the information in an existing algorithm only extensively, the procedure can be implemented with a minimum change in the system.

(C3) The behavior of the system that a memory access operation becomes abnormal due to an address calculation which is no more normal and a malfunction involving the detection of a system error and reactivation occurs is used as the viewpoint. The system information monitor unit 22 outputs information indicating that the OS has normally shut down as the system information. When the OS has not normally shut down on a previous shutdown, the malfunction determination unit 23 determines that the semiconductor circuit 12 is not normally operating at the reactivation of the OS. In the other cases, the malfunction determination unit 23 determines that the semiconductor circuit 12 is normally operating. Since the method uses the operation of an existing OS only extensively, it can be implemented with a minimum change in the system.

(C4) The behavior of the system that a memory access operation becomes abnormal due to an address calculation which is no more normal and a malfunction involving the detection of an application error and termination of the application is used as the viewpoint. The semiconductor circuit 12 is executing, e.g., an application program and the system information monitor unit 22 outputs information indicating that an error (application error) has occurred during the execution of the program as the system information. When an application error has occurred, the malfunction determination unit 23 determines that the semiconductor circuit 12 is not normally operating. In the other cases, the malfunction determination unit 23 determines that the semiconductor circuit 12 is normally operating. Since the procedure uses the operation of an existing OS only extensively, it can be implemented with a minimum change in the system.

(C5) The semiconductor circuit 12 comprises a register having a set-up error detecting function. When a set-up error is detected, the malfunction determination unit 23 determines that the system is abnormal. In accordance with the procedure, it is necessary to add a circuit but, since determination focusing attention on critical paths is allowed as will be described later, it becomes possible to effectively correct the circuit characteristics when a malfunction dependent on a delay has occurred.

Figure 3A:
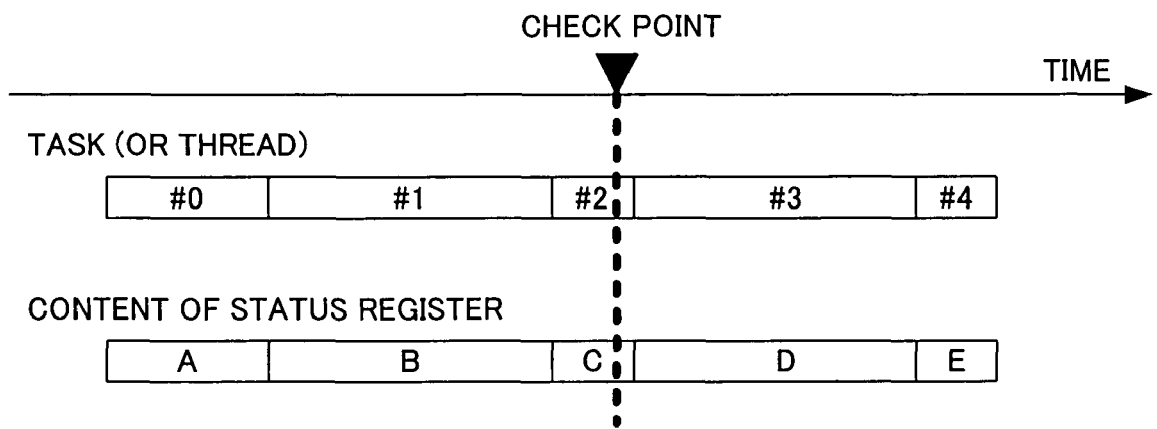
FIG. 3A is an illustrative view showing an example of system information when the semiconductor circuit of FIG. 1 is normally operating and FIG. 3B is an illustrative view showing an example of the system information when the semiconductor circuit of FIG. 1 is not normally operating.
Figure 3B:
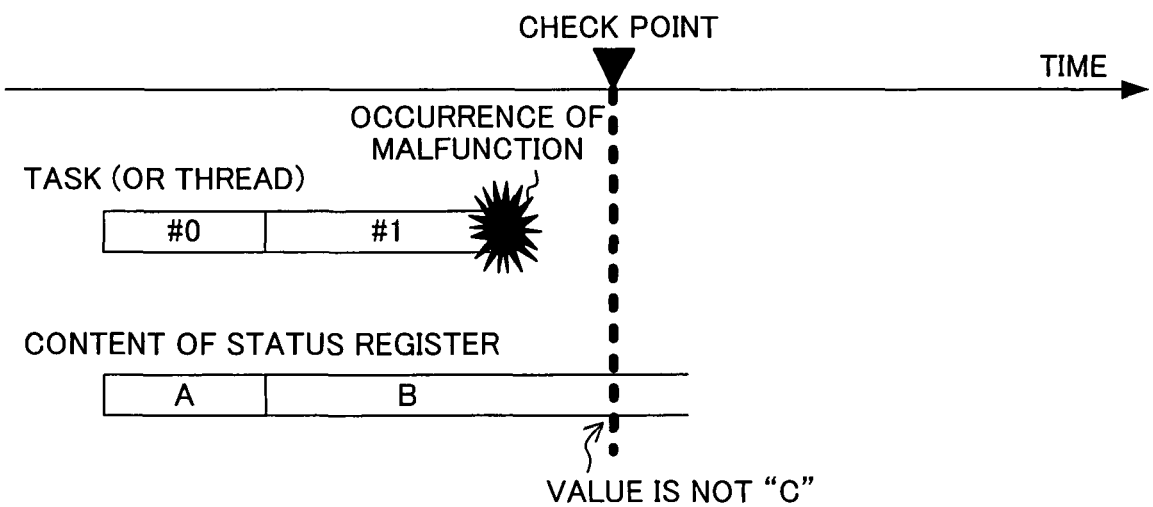

FIG. 3A is an illustrative view showing an example of the system information when the semiconductor circuit 12 of FIG. 1 is normally operating. FIG. 3B is an illustrative view showing an example of the system information when the semiconductor circuit 12 of FIG. 1 is not normally operating. Each of FIGS. 3A and 3B specifically shows the procedure (C1).

In the case of FIG. 3, it is assumed that the semiconductor circuit 12 comprises a status register and successively executes tasks #0, #1, #2, . . . . The status register is a register the value of which changes in association with the execution of a task or a thread. The system information monitor unit 22 acquires the value of the status register as the system information and outputs it.

During a normal operation as shown in FIG. 3A, the value of the status register sequentially changes in association with the execution of the task or thread so that the status register has a predetermined value C at the check point in FIG. 3A.

In FIG. 3B, the malfunction of the circuit and the execution of the task #1 halts. In this case, the value B of the status register remains unchanged so that the status register does not have the predetermined value C at the check point. As a result, the malfunction determination unit 23 can determine that the system is abnormal.

Figure 4A:
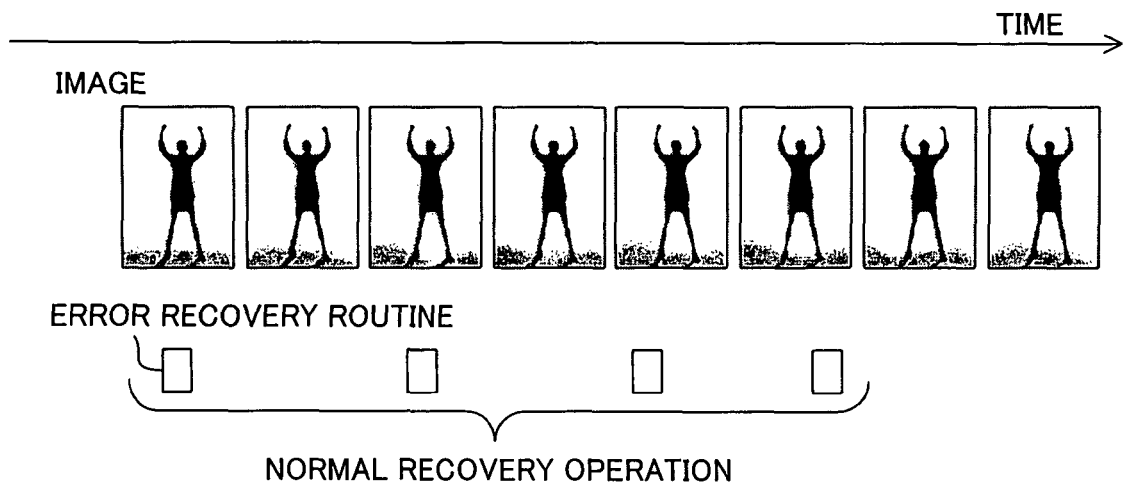
FIG. 4A is an illustrative view showing another example of the system information when the semiconductor circuit of FIG. 1 is normally operating and FIG. 4B is an illustrative view showing another example of the system information when the semiconductor circuit of FIG. 1 is not normally operating.
Figure 4B:
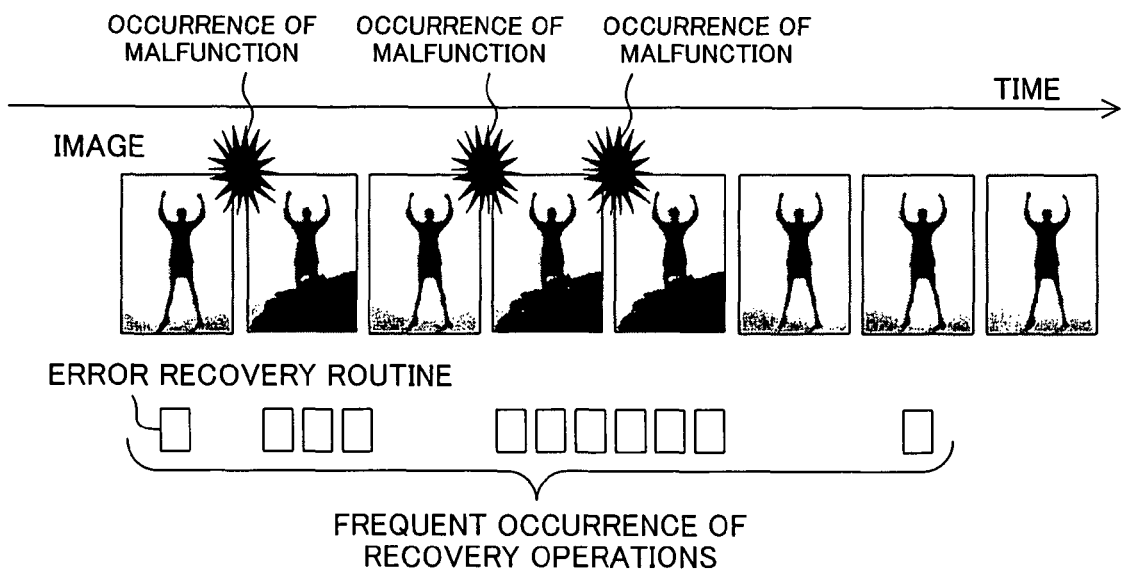

FIG. 4A is an illustrative view showing another example of the system information when the semiconductor circuit 12 of FIG. 1 is normally operating. FIG. 4B is an illustrative view showing still another example of the system information when the semiconductor circuit 12 of FIG. 1 is not normally operating. Each of FIGS. 4A and 4B specifically shows the procedure (C2).

In the case of FIG. 4, it is assumed that the semiconductor circuit 12 is a circuit for performing image processing. The system information monitor unit 22 acquires routine call information indicating that an error recovery routine for performing a process for recovering an error has been called from the semiconductor circuit 12 as the system information and outputs the routine call information.

In the image processing or the like, the error recovery routine is executed to perform data correction (maximum value clipping, interpolation) due to a data loss or the like. Since data losses are not many during the normal operation, the number of times the error recovery routine is called is not many, as shown in FIG. 4A.

In FIG. 4B, an arithmetic operation error due to the malfunction of the circuit occurs so that image data is abnormal. Therefore, to implement a recovery operation, the error recovery routine is called frequently. As a result, the malfunction determination unit 23 can determine that the system is abnormal.

Figure 5:
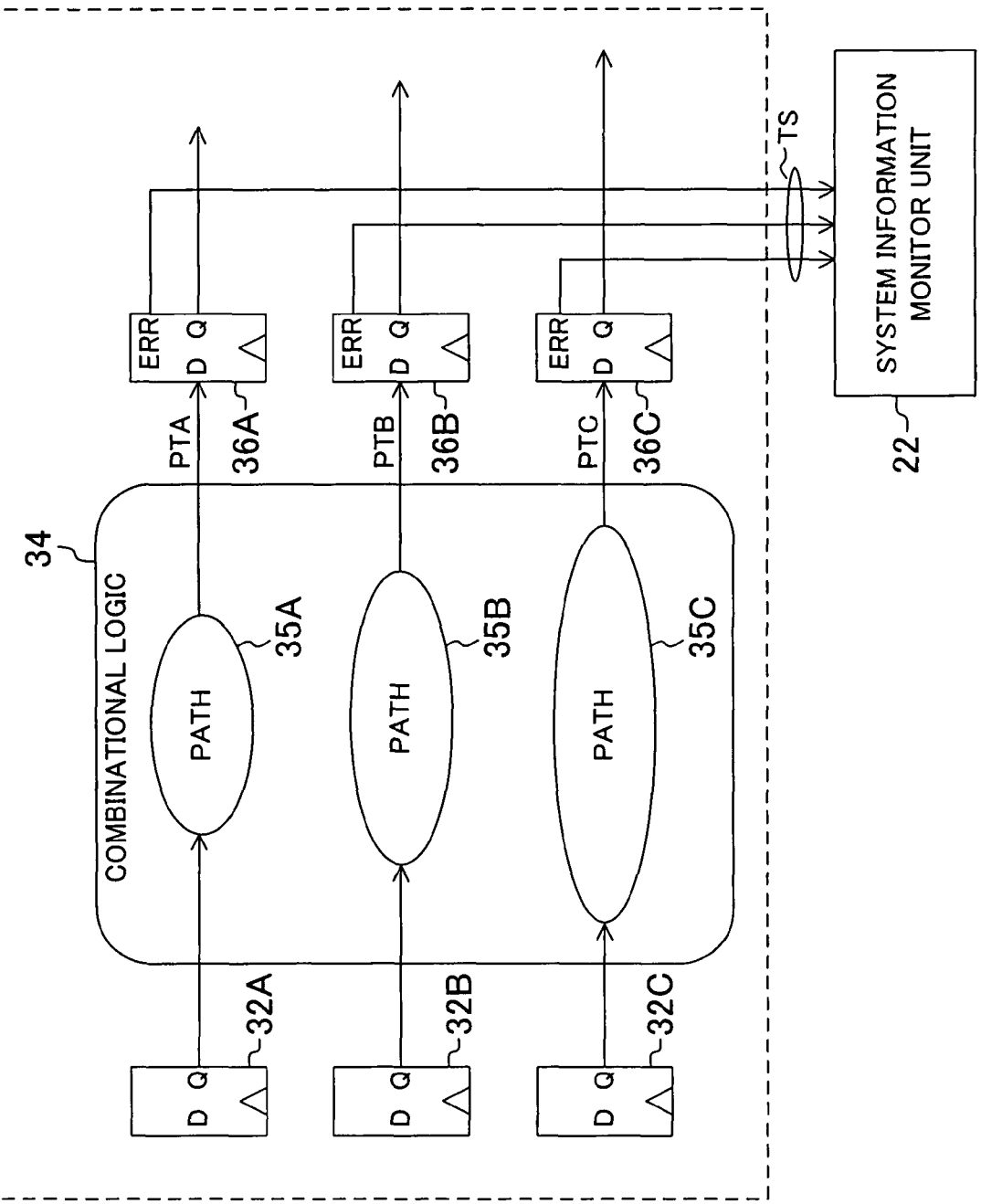
FIG. 5 is a block diagram showing an example of a structure of the semiconductor circuit of FIG. 1.

FIG. 5 is a block diagram showing an example of a structure of the semiconductor circuit 12 of FIG. 1. The semiconductor circuit 12 of FIG. 5 comprises registers 32A, 32B, 36A, 36B, and 36C and a combinational logic 34. The combinational logic 34 has paths 35A, 35B, and 35C. Each of the registers 36A to 36C has the set-up error detecting function.

The registers 36A to 36C are connected to the paths 35A to 35C, respectively. The paths 35A to 35C are the critical paths of the combinational logic 34. The registers 36A to 36C outputs an error detection result (error signal) as the output signal TS to the system information monitor unit 22. The system information monitor unit 22 outputs information indicating the error detection result from the registers 36A to 36C as the system information.

Figure 6:
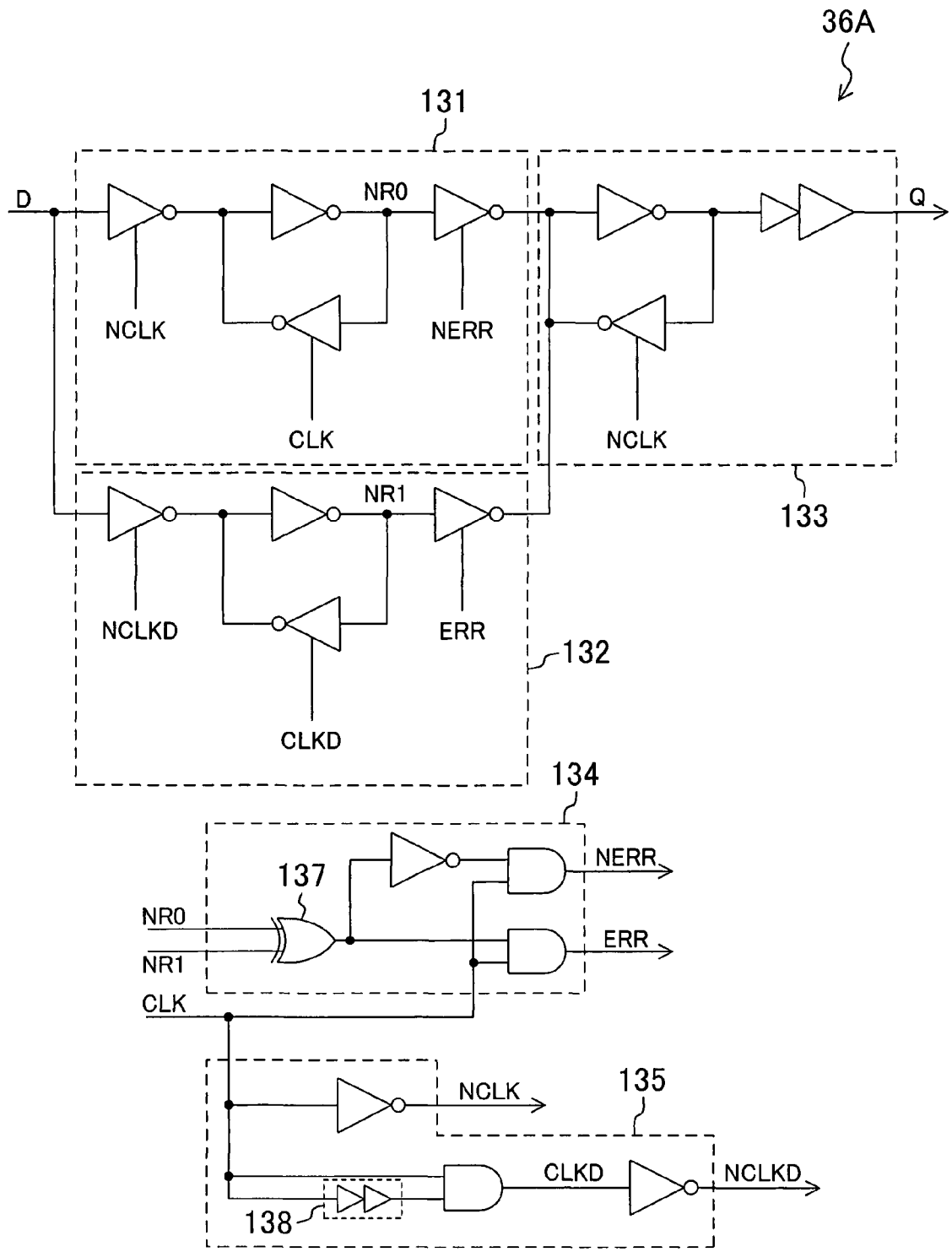
FIG. 6 is a circuit diagram showing an example of a structure of the register having a set-up error detecting function of FIG. 5.

FIG. 6 is a circuit diagram showing an example of a structure of the register 36A having the set-up error detecting function of FIG. 5. The register 36A is a master-slave flip-flop and comprises master latches 131 and 132, a slave latch 133, an error detection circuit 134, and a clock delay circuit 135. Each of the registers 36B and 36C is constructed similarly to the register 36A.

The clock delay circuit 135 has a delay element 138 and generates a clock signal NCLK and delay clock signals CLKD and NCLKD based on a clock signal CLK. The delay element 138 delays the clock signal CLK. The delayed clock signal CLK has the waveform thereof shaped and is outputted as the delay clock signal CLKD. The clock signal NCLK and the delay clock signal NCLKD are signals obtained by inverting the respective logic levels of the clock signal CLK and the delay clock signal CLKD.

The master latch 131 latches a register input D in synchronization with the clock signals CLK and NCLK. The master latch 132 latches the register input D in synchronization with the delay clock signals CLKD and NCLKD. The value latched by the master latch 132 is determined after the value latched by the master latch 131 is determined. The master latches 131 and 132 have respective nodes NR0 and NR1.

An exclusive OR gate 137 obtains an exclusive OR between the value of the node NR0 and the value of the node NR1. The error detection circuit 134 outputs a logical OR between the obtained exclusive OR and the clock signal CLK as an error signal ERR, while outputting a logical OR between a signal obtained by inverting the obtained exclusive OR and the clock signal CLK as an error signal NERR. Accordingly, when the clock signal CLK is at a high potential ("H") and the value of the node NR0 does not coincide with the value of the node NR1, the error signal ERR becomes "H". When the clock signal CLK is "H" and the value of the node NR0 coincides with the value of the node NR1, the error signal NERR becomes "H".

When the error signal NERR is "H", the master latch 131 inverts the value of the node NR0 and outputs the inverted value to the slave latch 133. When the error signal ERR is "H", the master latch 132 inverts the value of the node NR1 and outputs the inverted value to the slave latch 133. The slave latch 133 latches the inputted value in synchronization with the clock signal NCLK.

Figure 7:
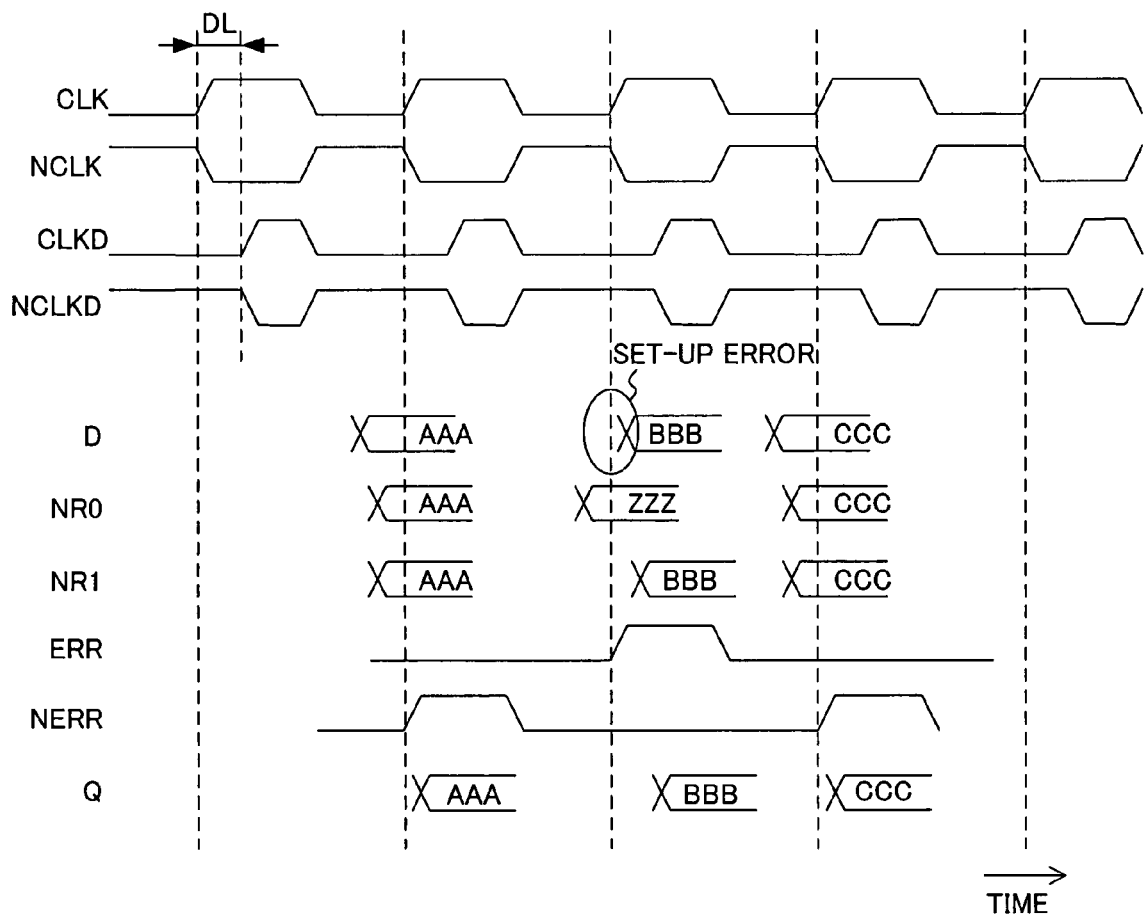
FIG. 7 is a timing chart showing an example of an operation of the register of FIG. 6.

FIG. 7 is a timing chart showing an example of the operation of the register 36A of FIG. 6. The delay DL shows the delay of the delay clock signal CLKD from the clock signal CLK. To the register 36A, the values AAA, BBB, and CCC are successively given as the register inputs D.

When the value AAA is inputted, the value AAA has been determined as the register input D by the rising edge of the clock signal CLK. As a result, the value AAA is determined as each of the values of the nodes NR0 and NR1 so that a set-up error does not occur. Consequently, the error signal NERR becomes "H", the output of the master latch 131 is inputted to the slave latch 133, and the value AAA is outputted as a register output Q.

By contrast, when the value BBB is inputted, the value BBB has not been determined as the register input D by the rising edge of the clock signal CLK. As a result, the node NR0 has an abnormal value ZZZ, which indicates that a set-up error has occurred. Thereafter, the value BBB is determined as the register input D by the rising edge of the delay clock signal CLKD so that the node NR1 has the value BBB.

Since the node NR0 and the node NR1 have different values, the error signal ERR becomes "H" so that the output of the master latch 132 is inputted to the slave latch 133 and the value BBB is outputted as the register output Q. That is, a normal value is outputted even though a set-up error has occurred.

Thus, the register 36A of FIG. 6 not only performs the detection of a set-up error but also allows the correction of the output to a correct value even when a set-up error has occurred. Since an error detection period can be defined with the magnitude of a delay caused by the delay element 138, settings for error detection can be made in accordance with the states of the critical paths.

A description will be given to the generation of the circuit characteristic information by the circuit characteristic monitor unit 14. The circuit characteristic monitor unit 14 determines the circuit characteristic information in accordance with any of the following procedures (D1) to (D6).

(D1) When noise is the malfunction factor, the circuit characteristic monitor unit 14 measures the glitch height (magnitude of noise) on a specified line and designates the result of the measurement as the circuit characteristic information. Since it is sufficient for the procedure to measure only the voltage level, the circuit characteristic monitor unit 14 can be simplified.

(D2) When noise is the malfunction factor, the circuit characteristic monitor unit 14 measures the slew time on a specified line (either an Aggressor line or a Victim line) and determines the result of the measurement as the circuit characteristic information. Since noise occurs depending on the relative relationship between signals, the procedure allows correction to be performed in accordance with the state of the occurrence of noise.

(D3) When delay is the malfunction factor, the circuit characteristic monitor unit 14 measures a delay on a specified path and determines the result of the measurement as the circuit characteristic information. Since the delay is dependent on an operation pattern, the procedure allows correction to be performed in accordance with the state of the occurrence of a delay.

(D4) When poor retention is the malfunction factor, the circuit characteristic monitor unit 14 measures a logic level propagated from the output of the register or the flip-flop and determines the result of the measurement as the circuit characteristic information. By holding the value of the logic level immediately before a standby mode is established and comparing the held value with a value after the standby mode, the malfunction factor can be easily determined.

(D5) The circuit characteristic monitor unit 14 measures the power supply voltage or temperature of the semiconductor circuit 12 or the like and determines the result of the measurement as the circuit characteristic information. The procedure allows separate determination of a factor other than process conditions.

(D6) When delay is the malfunction factor, the circuit characteristic monitor unit 14 determines the error detection result outputted from any of the registers 36A to 36C having the set-up error detecting function of FIG. 5 as the circuit characteristic information. The information allows the determination of the register from which an error signal is outputted and thereby allows the specification of the path that has caused a set-up error due to the delay.

Figure 8:
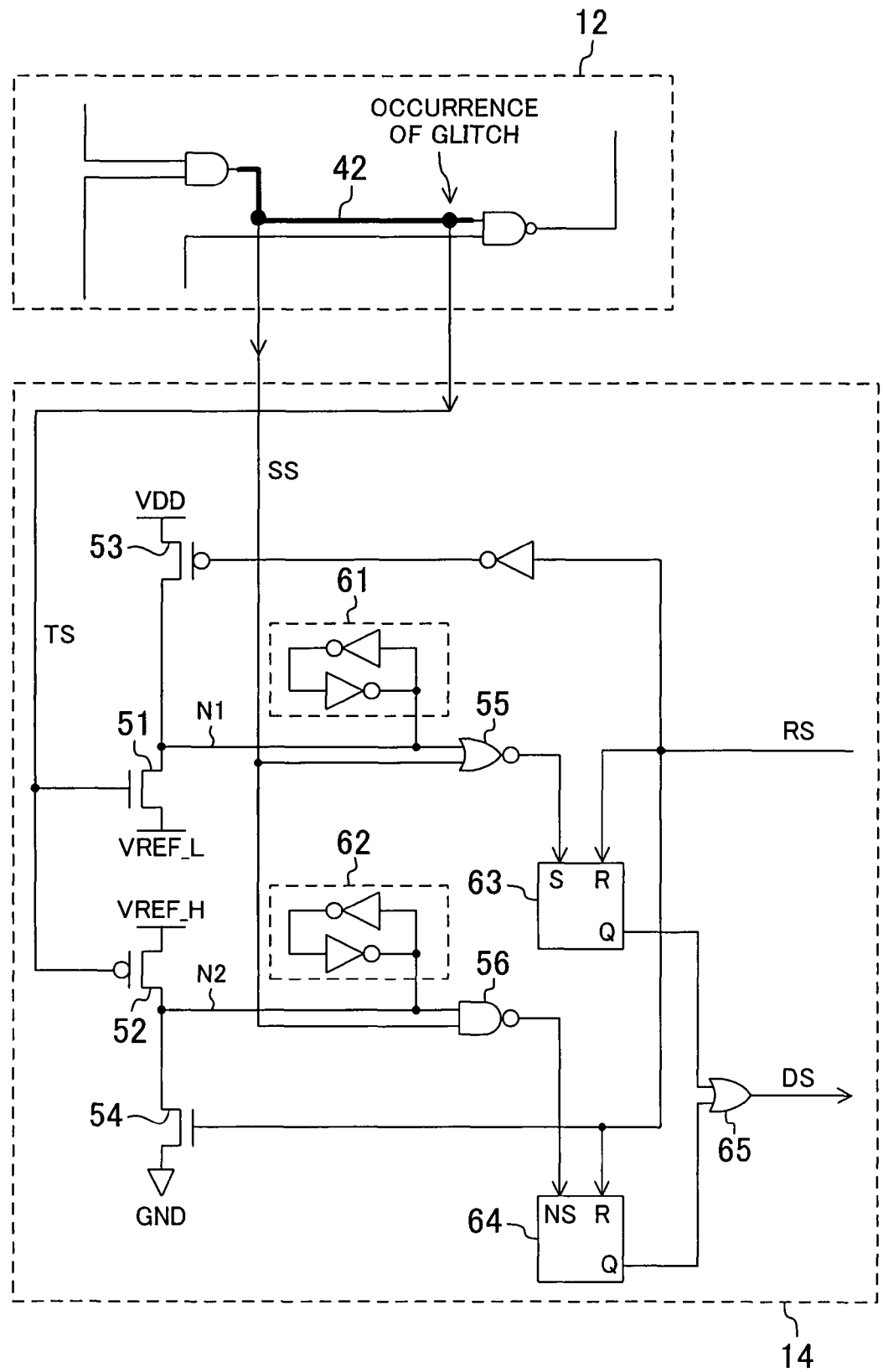
FIG. 8 is a circuit diagram showing an example of a structure of the circuit characteristic monitor unit of FIG. 1.

FIG. 8 is a circuit diagram showing an example of a structure of the circuit characteristic monitor unit 14 of FIG. 1. The circuit of FIG. 8 specifically performs the operation in accordance with the procedure (D1) with respect to the semiconductor circuit 12. The circuit characteristic monitor unit 14 of FIG. 8 comprises NMOS (n-channel metal oxide semiconductor) transistors 51 and 54, PMOS (p-channel metal oxide semiconductor) transistors 52 and 53, a NOR gate 55, a NAND gate 56, keeper circuits 61 and 62, RS latches (flip-flops) 63 and 64, and an OR gate 65. In FIG. 8, only a part of the semiconductor circuit 12 is shown.

The semiconductor circuit 12 has a wire 42 and the circuit characteristic monitor unit 14 measures a glitch occurred on the wire 42. A signal at the starting point of the wire 42 is given as the reference signal SS to each of the NOR gate 55 and the NAND gate 56. A signal at the end point of the wire 42 is given as the detection target signal TS to the gate of each of the NMOS transistor 51 and the PMOS transistor 52. Reference voltages VREF_L and VREF_H are given to the respective sources of the NMOS transistor 51 and the PMOS transistor 52.

When the reset signal RS becomes "H", each of the PMOS transistor 53 and the NMOS transistor 54 is turned on so that the dynamic node N1 becomes "H", the dynamic node N2 is placed at a low potential ("L"), and the latches 63 and 64 are reset. The keeper circuits 61 and 62 hold the respective logic levels at the dynamic nodes N1 and N2.

Figure 9A:
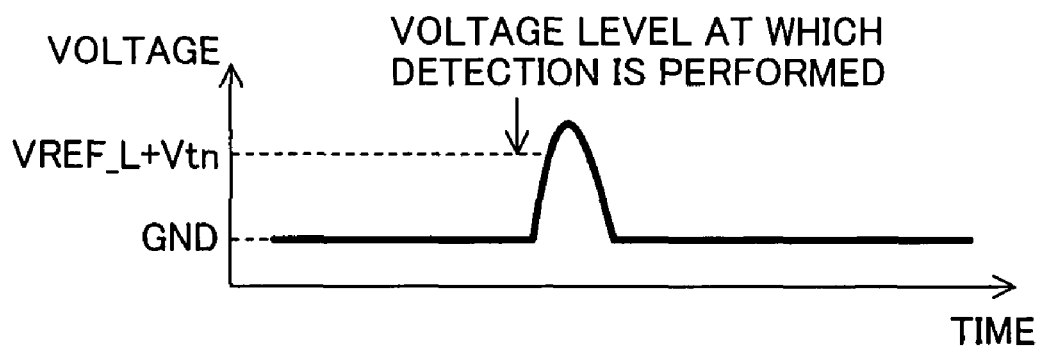
FIG. 9A is an illustrative view of a level at which a glitch (noise) is detected when a positive pulse is detected and FIG. 9B is an illustrative view of a level at which the glitch is detected when a negative pulse is detected.
Figure 9B:
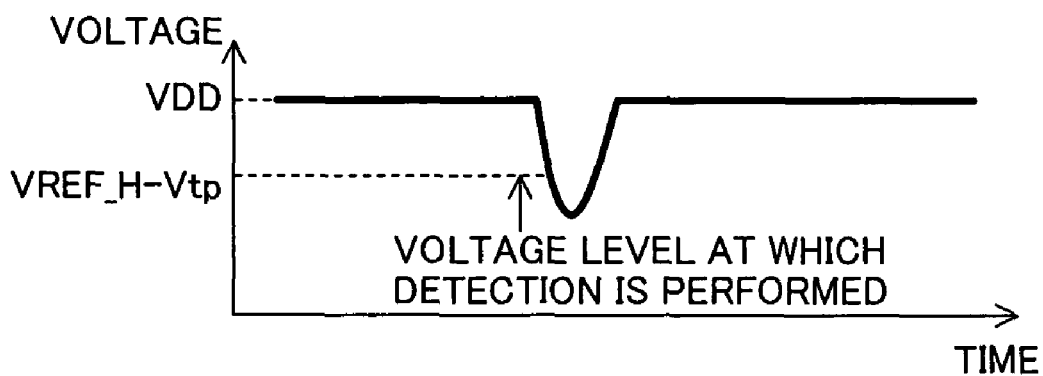

FIG. 9A is an illustrative view of a level at which a glitch (noise) is detected when a positive pulse is detected. FIG. 9B is an illustrative view of a level at which the glitch is detected when a negative pulse is detected. The threshold voltage of the NMOS transistor 51 is represented by Vtn and the threshold voltage of the PMOS transistor 52 is represented by Vtp.

When the reference signal SS is "L" and the detection target signal TS becomes higher than the detection level VREF_L+Vtn as shown in FIG. 9A, the NMOS transistor 51 is turned on so that the potential at the dynamic node N1 decreases. As a result, the output of the NOR gate 55 becomes "H" so that the latch 63 is set and the OR gate 65 brings the detection signal DS as the circuit characteristic information to the "H" level.

When the reference signal SS is "H" and the detection target signal TS becomes lower than the detection level VREF_H−Vtp as shown in FIG. 9B, the PMOS transistor 52 is turned on so that the potential at the dynamic node N2 increases. As a result, the output of the NAND gate 56 becomes "L" so that the latch 64 is set and the OR gate 65 brings the detection signal DS to the "H" level.

Thus, the circuit of FIG. 8 allows the glitch height to be measured by setting the reference voltages VREF_L and VREF_H.

Figure 10:
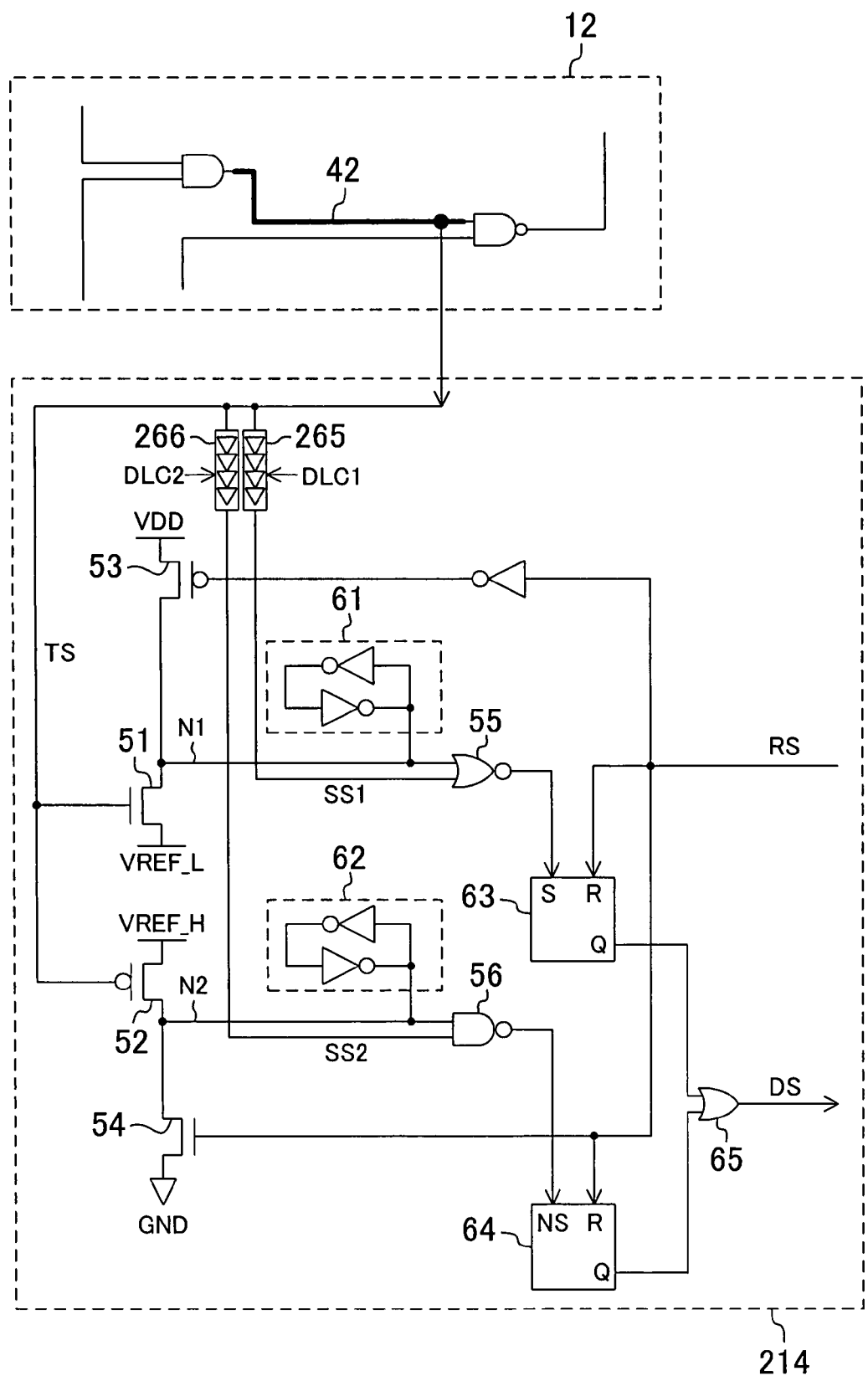
FIG. 10 is a circuit diagram showing a first variation of the structure of the circuit characteristic monitor unit of FIG. 1.

FIG. 10 is a circuit diagram showing a first variation of the structure of the circuit characteristic monitor unit 14 of FIG. 1. The circuit of FIG. 10 specifically performs the operation in accordance with the procedure (D2) with respect to the semiconductor circuit 12. A circuit characteristic monitor unit 214 in FIG. 10 further comprises variable delay buffers 265 and 266 in addition to the components of the circuit characteristic monitor unit 14 of FIG. 8. In FIG. 10, only a part of the semiconductor circuit 12 is shown.

The circuit characteristic monitor unit 214 measures the slew time of the signal on the wire 42 of the semiconductor circuit 12. The signal on the wire 42 is given as the detection target signal TS to the gate of each of the NMOS transistor 51 and the PMOS transistor 52. The detection target signal TS is also given as reference signals SS1 and SS2 to the NOR gate 55 and the NAND gate 56 via the variable delay buffers 265 and 266. The variable delay buffers 265 and 266 have respective delays controlled by delay control signals DLC1 and DLC2.

When the reference signal SS1 is "L", the operation of the NMOS transistor 51 is propagated to the output of the NOR gate 55. When the reference signal SS2 is "H", the operation of the PMOS transistor 52 is propagated to the output of the NAND gate 56. Accordingly, when the reference signal SS1 is "L", the shift of the detection target signal TS from the "L" level to the "H" level can be detected. When the reference signal SS2 is "H", the shift of the detection target signal TS from the "H" level to the "L" level can be detected. The circuit characteristic monitor unit 214 is otherwise the same as the circuit characteristic monitor unit 14 of FIG. 8.

Figure 11A:
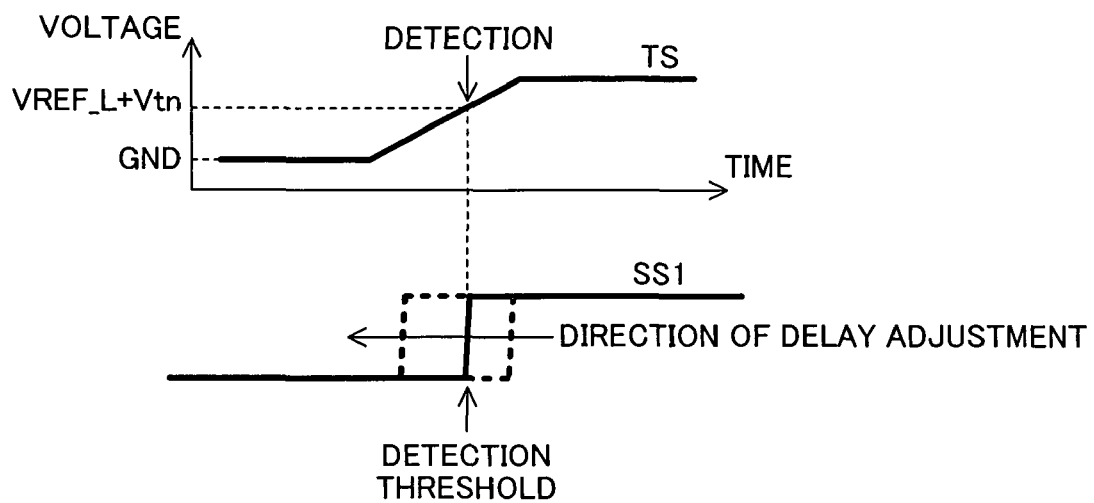
FIG. 11A is an illustrative view of the detection of a slew time when a detection target signal TS shifts from a "L" level to a "H" level and FIG. 11B is an illustrative view of the detection of the slew time when the detection target signal TS shifts from the "H" level to "L" level.
Figure 11B:
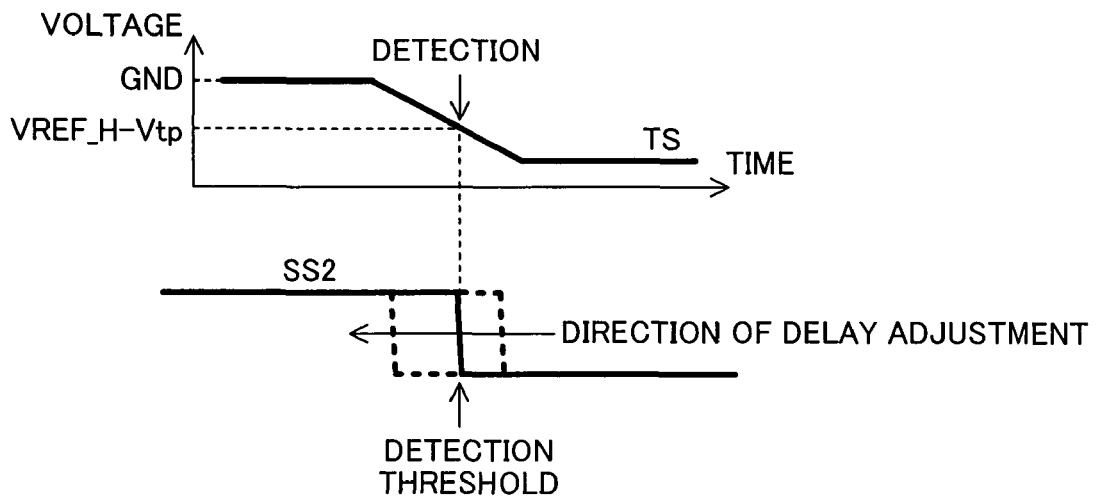

FIG. 11A is an illustrative view of the detection of a slew time when the detection target signal TS shifts from the "L" level to the "H" level. FIG. 11B is an illustrative view of the detection of the slew time when the detection target signal TS shifts from the "H" level to the "L" level.

In the case of FIG. 11A, the level shift of the detection target signal TS can be detected only when the reference signal SS1 is "L". Accordingly, the detection of the level shift is performed, while reducing a delay in the variable delay buffer 265 from a larger value to a smaller value with the delay control signal DLC1. When the delay is large, the level shift is detected but, when the delay reaches a detection threshold, the level shift is no more detected. Therefore, a slew time which is a time required for the level shift of the detection target signal TS can be determined as the circuit characteristic information from the delay time at that time.

In the case of FIG. 11B, the level shift of the detection target signal TS can be detected only when the reference signal SS2 is "H". Accordingly, the level shift is detected, while reducing a delay in the variable delay buffer 266 from a larger value to a smaller value with the delay control signal DLC2. When the delay is large, the level shift is detected but, when the delay reaches the detection threshold, the level shift is no more detected. Therefore, the slew time of the detection target signal TS can be determined from the delay time at that time.

Thus, the circuit of FIG. 10 allows the measurement of the slew time by setting the reference voltages VREF_L and VREF_H.

Figure 12:
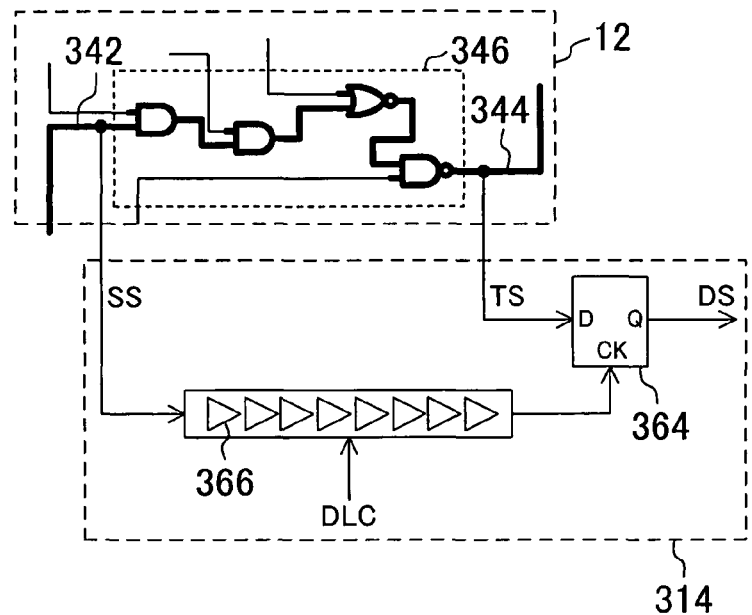
FIG. 12 is a circuit diagram showing a second variation of the structure of the circuit characteristic monitor unit of FIG. 1.

FIG. 12 is a circuit diagram showing a second variation of the structure of the circuit characteristic monitor unit 14 of FIG. 1. The circuit of FIG. 12 specifically performs the operation in accordance with the procedure (D3) with respect to the semiconductor circuit 12. A circuit characteristic monitor unit 314 in FIG. 12 comprises a flip-flop (latch) 364 and a variable delay buffer 366. In FIG. 12, only a part of the semiconductor circuit 12 is shown.

The semiconductor circuit 12 has wires 342 and 344 and a measurement target circuit 346. The wire 342 transmits a signal given to a measurement target circuit 346. The wire 344 transmits a signal outputted from the measurement target circuit 346. The circuit characteristic monitor unit 314 measures a delay occurred in the measurement target circuit 346, i.e., a delay in a signal on a path from the wire 342 to the wire 344.

The signal on the wire 342 is given as the reference signal SS to the variable delay buffer 366. An output signal from the variable delay buffer 366 is given as a clock signal to the flip-flop 364. The signal TS on the wire 344 is given to the input D of the flip-flop 364. The flip-flop 364 outputs the detection signal DS as the circuit characteristic information. The variable delay buffer 366 has a delay controlled with a delay control signal DLC.

When the delay in the variable delay buffer 366 is sufficiently larger than the delay in the measurement target circuit 346, the signal TS is correctly captured by the flip-flop 364. The delay time in the measurement target circuit can be determined from the delay value in the variable delay buffer 366 at the time (time at which the capture becomes unstable) at which the value of the detection signal DS changes as a result of sequentially varying the delay control signal DLC.

Figure 13:
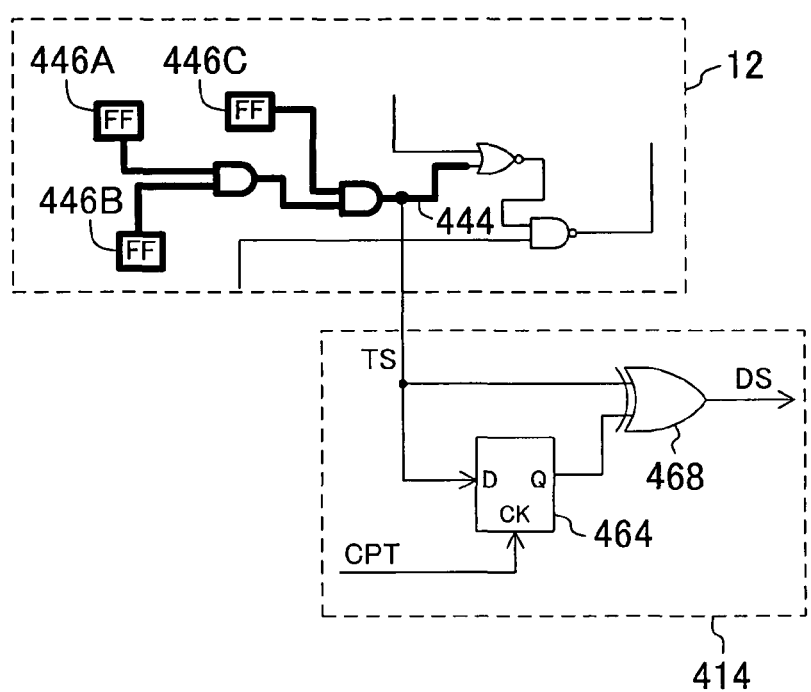
FIG. 13 is a circuit diagram showing a third variation of the structure of the circuit characteristic monitor unit of FIG. 1.

FIG. 13 is a circuit diagram showing a third variation of the structure of the circuit characteristic monitor unit 14 of FIG. 1. The circuit of FIG. 13 specifically performs the operation in accordance with the procedure (D4) with respect to the semiconductor circuit 12. A circuit characteristic monitor unit 414 in FIG. 13 comprises a flip-flop (latch) 464 and an exclusive OR gate 468 as a comparison circuit. In FIG. 13, only a part of the semiconductor circuit 12 is shown.

The semiconductor circuit 12 comprises flip-flops 446A, 446B, and 446C as holding circuits. The circuit characteristic monitor unit 414 detects a malfunction due to the poor retention of the flip-flops 446A to 446C.

A signal at the logic cone end point 444 of the flip-flops 446A to 446C is given to the input D of the flip-flop 464 and to the exclusive OR gate 468. A capture signal CPT is given as a clock signal to the flip-flop 464. The flip-flop 464 outputs the captured signal to the exclusive OR gate 468.

The flip-flop 464 is supplied with a power from a power supply circuit different from a power supply circuit supplying a power to each of the flip-flops 446A to 446C. Before the semiconductor circuit 12 shifts to a standby mode, the flip-flop 464 preliminarily captures the signal at the logic cone end point 444 as the detection target signal TS in response to the capture signal CPT.

Then, the semiconductor circuit 12 shifts to the standby mode so that the power supply voltage supplied to the semiconductor circuit 12 decreases. Thereafter, the semiconductor circuit 12 returns to a normal mode. At that time, when the value of any of the flip-flops 446A to 446C as measurement targets is abnormal, the value of the detection target signal TS has changed to be different from that before the shift to the standby mode so that the exclusive OR gate 468 outputs 1 as the detection signal (circuit characteristic information) DS.

It is also possible to supply the flip-flop 464 with the power supplied from the same power supply circuit that supplies the power to each of the flip-flops 446A to, 446C and enhance the retention of the flip-flop 464. Instead of the exclusive OR gate 468, a comparator which outputs a signal indicating whether or not the inputted two signals coincide with each other may also be used.

Since the signals of the actually operating circuits are thus used as shown in FIGS. 8, 10, 12, and 13, actual circuit characteristics can be measured.

The correction target determination unit 25 also performs adaptive correction in accordance with a use situation by using the system information. In the correction target determination step S24 of FIG. 2, the correction target determination unit 25 estimates the use situation of the semiconductor circuit 12 from the system information and determines a strategy for a correction feedback. For example, the strategy for the correction feedback is determined in accordance with any of the following procedures (E1) to (E5).

(E1) The system information monitor unit 22 outputs data indicating a remaining power in a battery serving as the power supply of the semiconductor circuit 12 as the system information. When the remaining power in the battery is low, the correction target determination unit 25 corrects the operating conditions such that a malfunction is less likely to occur without increasing a consumed current as the strategy for the correction feedback. Specifically, the objective electrical characteristic information CI is generated to implement correction for increasing a power supply voltage supplied to the semiconductor circuit 12 and decreasing the operating frequency of the semiconductor circuit 12. The strategy allows the semiconductor circuit 12 to operate anyway, while circumventing a reduction in operating time, though the response deteriorates.

(E2) In an environment in which a software error is likely occur such as in an air plane, temporary correction is performed as the strategy for the correction feedback. For example, the environment is recognized by checking using a man machine interface such as a dialog interface or by referencing information indicating that the semiconductor circuit 12 was in the standby mode immediately before. Specifically, the correction target determination unit 25 temporarily increases the power supply voltage supplied to the semiconductor circuit 12 and then periodically reduces the power supply voltage, thereby examining whether or not a malfunction occurs when the power supply voltage is reduced. When a malfunction does not occur, the objective electrical characteristic information CI is generated to terminate the correction for increasing the power supply voltage. The strategy can implement correction in accordance with the environment, which does not result in exaggerated specifications (E3) The system information monitor unit 22 outputs information on the temperature of the semiconductor circuit 12 as the system information. When the semiconductor circuit 12 is in a high-temperature environment, the correction target determination unit 25 corrects the operating conditions such that a malfunction is less likely to occur without increasing a leakage current as the strategy for the correction feedback. Specifically, the correction target determination unit 25 generates the objective electrical characteristic information CI to implement correction for increasing the power supply voltage supplied to the semiconductor circuit 12 and allowing the substrate bias of the semiconductor circuit 12 to provide a larger back bias or correction for reducing the operating frequency of the semiconductor circuit 12. The fact that the semiconductor circuit 12 is in a high-temperature environment can be recognized from an output of a temperature sensor. The strategy allows the semiconductor circuit 12 to operate anyway, while circumventing the problem of an increase in leakage current in a high-temperature environment, though the response deteriorates.

(E4) The system information monitor unit 22 reads the identification number of the semiconductor circuit 12 (or LSI 10) and outputs the identification number as the system information. The identification number is, e.g., a serial number, a processor ID, a lot number, or the like written in the semiconductor circuit 12 during the fabrication thereof and corresponds to the fabrication time of the semiconductor circuit 12. The correction target determination unit 25 estimates the fabrication time (fabrication year or the like) of the semiconductor circuit 12 from the system information and regards the fabrication time as a usage start time. When a predetermined period has elapsed from the fabrication time, the operating conditions are corrected such that a malfunction is less likely to occur without degrading the performance as the strategy for the correction feedback. Specifically, the correction target determination unit 25 generates the objective electrical characteristic information CI for increasing the power supply voltage supplied to the semiconductor circuit 12. The strategy allows the retention of the performance of the semiconductor circuit 12, though it shortens the battery lifetime.

(E5) The system information monitor unit 22 outputs information on the control of the power supply voltage of the semiconductor circuit 12 as the system information. When a set-up error is detected immediately after a control operation for reducing the power supply voltage is performed, there is the possibility that the set-up error has been missed by that time so that the correction target determination unit 25 changes the power supply voltage again.

Figure 14:
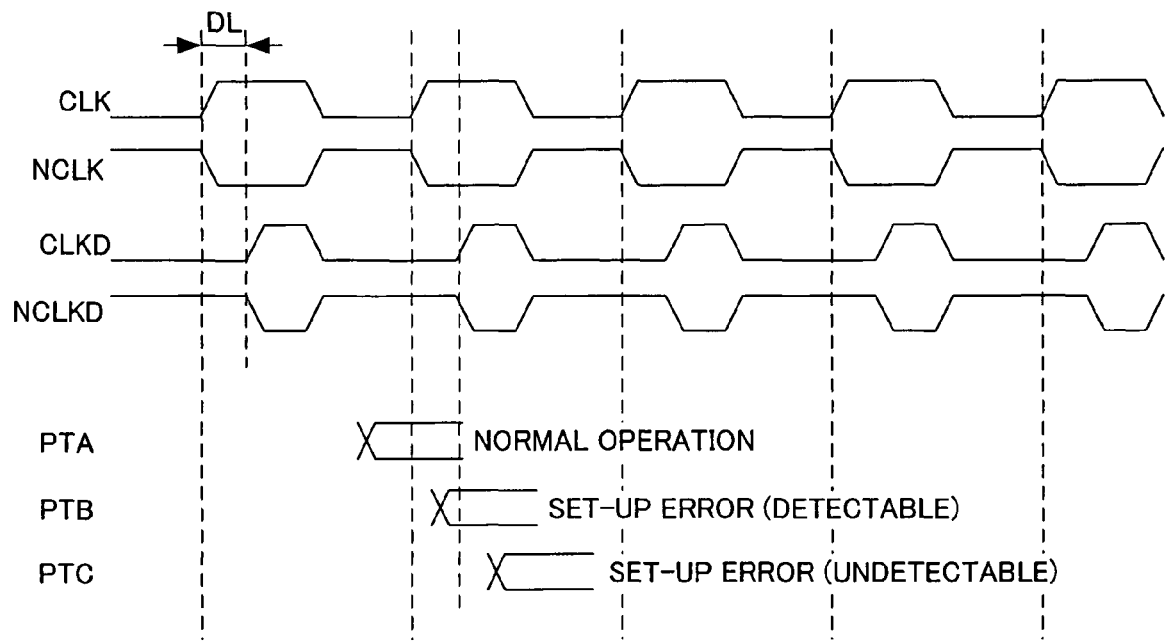
FIG. 14 is a timing chart related to the detection of a set-up error.

FIG. 14 is a timing chart related to the detection of a set-up error. A description will be given to the procedure (E5) with reference to FIGS. 5 and 14. By way of example, it is assumed that a set-up error is detected with the registers 36A to 36C of FIG. 5. To the registers 36A to 36C, respective signals PTA, PTB, and PTC are inputted. The signals PTA, PTB, and PTC are the respective outputs of the paths 35A, 35B, and 35C.

The error detection range of each of the registers 36A to 36C depends on an amount of delay in the delay element 138 of FIG. 6. Accordingly, a set-up error can be detected for the signal PTB but a set-up error cannot be detected for the signal PTC, as shown in FIG. 14.

When the power supply voltage is reduced, the delay in the combinational logic 34 increases and there is the possibility that a set-up error cannot be detected. Therefore, when a set-up error is detected, the correction target determination unit 25 generates objective electrical characteristic information CI for increasing the power supply voltage. This allows a malfunction to be prevented in advance.

Figure 15:
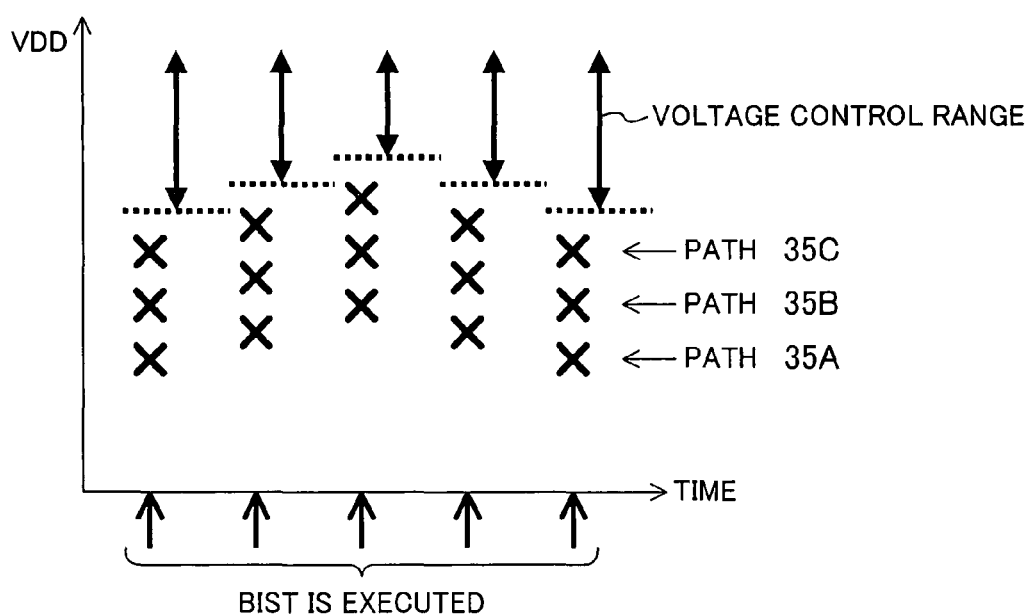
FIG. 15 is an illustrative view showing an example of a control range of a power supply voltage determined on each execution of a BIST.

The procedure (E5) can further enhance the malfunction preventing effect when used in combination with a built-in self test (BIST). FIG. 15 is an illustrative view showing an example of a control range of a power supply voltage determined on each execution of the BIST. For example, as shown in FIG. 15, the semiconductor circuit 12 periodically performs the BIST. In performing the BIST, the semiconductor circuit 12 activates the paths 35A to 35C and causes the registers 36A to 36C to detect a set-up error, while varying a power supply voltage VDD.

The correction target determination unit 25 determines the lower limit (indicated by x in FIG. 15) of the power supply voltage at which a set-up error is not detected for each of the paths 35A to 35C (signals PTA, PTB, and PTC). The correction target determination unit 25 also determines a range of the power supply voltage in which a set-up error is not defected for any of the paths 35A to 35C and generates the objective electrical characteristic information CI indicating the range on each execution of the BIST. When a set-up error is detected after reducing the power supply voltage, the electrical characteristic control unit 16 increases the power supply voltage to a value within the determined power supply voltage range. This prevents the detection of a set-up error from being impossible.

A description will be given to the target of correction in the semiconductor circuit 12, which is performed by the electrical characteristic control unit 16. The electrical characteristic control unit 16 performs the correction of the semiconductor circuit 12 based on the objective electrical characteristic information CI in accordance with, e.g., the following procedures (F1) to (F9).

(F1) When noise is the malfunction factor, to correct the ability to drive the node, the electrical characteristic control unit 16 changes the number of the plurality of drive transistors connected in parallel to drive the node as the correction target. The procedure can implement the correction of the semiconductor circuit 12 by changing the circuit structure without performing the control of the substrate voltage.

(F2) When noise is the malfunction factor, to correct the ability to drive the node, the electrical characteristic control unit 16 controls the substrate voltage as the correction target. The procedure makes it possible to directly change the transistor characteristics.

(F3) When noise is the malfunction factor, to correct the threshold voltage of the transistor, the electrical characteristic control unit 16 controls the substrate voltage as the correction target. The procedure makes it possible to directly change the transistor characteristics.

(F4) When noise is the malfunction factor, to correct a wire-to-wire capacitance, the electrical characteristic control unit 16 controls a bias placed on a ferroelectric material as the correction target. The method makes it possible to change the characteristic of a wiring capacitance.

(F5) When delay is the malfunction factor, to correct the ability to drive the logic gate, the electrical characteristic control unit 16 controls the substrate voltage as the correction target. The method makes it possible to directly change the transistor characteristics.

(F6) When delay is the malfunction factor, to correct the operating conditions, the electrical characteristic control unit 16 controls the power supply voltage as the correction target. The method allows the correction of the semiconductor circuit 12 without involving the control of the substrate voltage and a change in the circuit.

(F7) When poor retention is the malfunction factor, to correct the operating conditions, the electrical characteristic control unit 16 controls the power supply voltage as the correction target. The method allows the correction of the semiconductor circuit 12 without involving the control of the substrate voltage and a change in the circuit.

(F8) When poor retention is the malfunction factor, to correct the threshold voltage of each of the flip-flops (latches), the electrical characteristic control unit 16 controls the substrate voltage as the correction target. The method makes it possible to directly change the transistor characteristics.

(F9) When delay is the malfunction factor, to correct the clock period, the clock signal is controlled as the correction target. For example, the clock period is temporarily extended by modulating the clock frequency. This allows the prevention of a set-up error.

The foregoing procedures (F1) to (F4) correspond to the procedures (A1) to (A4), respectively.

Figure 16A:
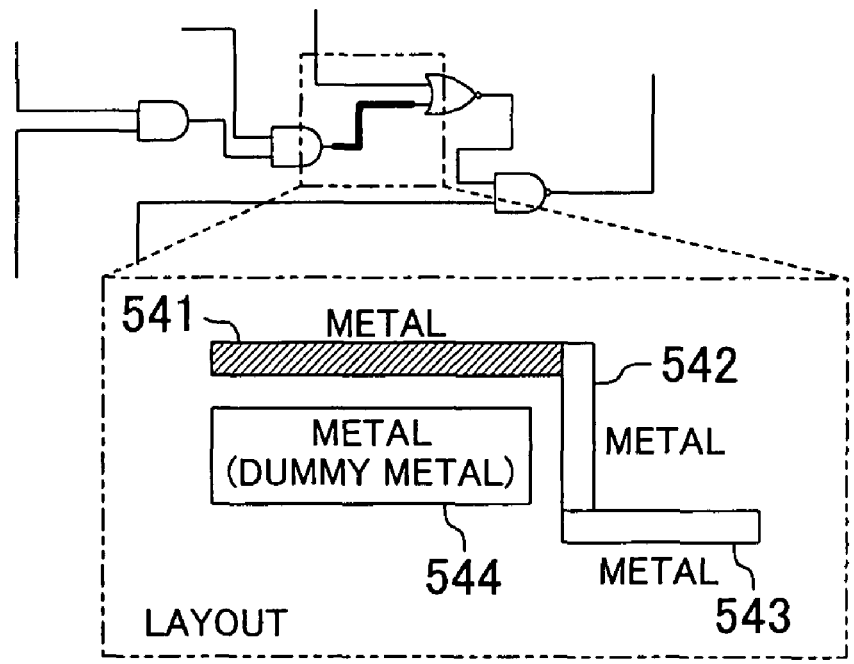
FIG. 16A is a layout diagram of wires in a part of the semiconductor circuit of FIG. 1
Figure 16B:
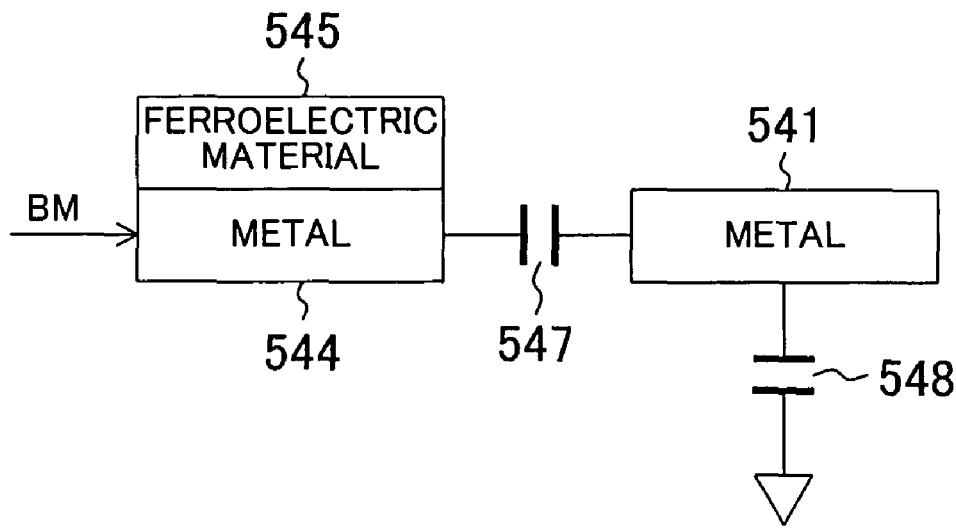
FIG. 16B is a circuit diagram showing a capacitance of the wires of FIG. 16A.

A description will be given to the case (procedure (F4)) where the bias placed on the ferroelectric material is controlled as the correction target. FIG. 16A is a layout diagram of wires in a part of the semiconductor circuit 12 of FIG. 1. FIG. 16B is a circuit diagram showing the capacitance of the wires of FIG. 16A. As shown in FIG. 16A, the semiconductor circuit 12 has wires 541, 542, and 543 and a dummy metal 544.

It is assumed that the wire 541 is a wire under noise influence from another wire or having noise influence on another wire and determined as the correction target wire. As shown in FIG. 16A, the dummy metal 544 is disposed in proximity to the wire 541 and the semiconductor circuit 12 has a ferroelectric material 545 over or under the dummy metal 544. The electrical characteristic control unit 16 controls a bias BM given to the dummy metal 544 in accordance with the objective electrical characteristic information CI. It is assumed that the value of the capacitance between the wire 541 and the ground GND is C10.

When the electrical characteristic control unit 16 electrically charges the ferroelectric material 545 with the bias BM, the dummy metal 544 can be fixed at a predetermined potential. For example, by fixing the dummy metal 544 at the VDD level, the effective value of a capacitance 547 between the wire 541 and the dummy metal 544 becomes zero when the wire 541 shifts from the GND level to the VDD level. At this time, the value of the parasitic capacitance of the wire 541 becomes C10. Conversely, when the wire 541 shifts from the VDD level to the GND level, the value of the capacitance 547 becomes C12. At this time, the value of the parasitic capacitance of the wire 541 becomes C10+C12 (see FIG. 16B).

That is, the parasitic capacitance of the wire 541 can be changed by properly changing the potential at the dummy metal 544. This makes it possible to change the coupling coefficient between the wire 541 and another wire or the like. The dummy metal 544 may also be fixed at the GND level.

Figure 17:
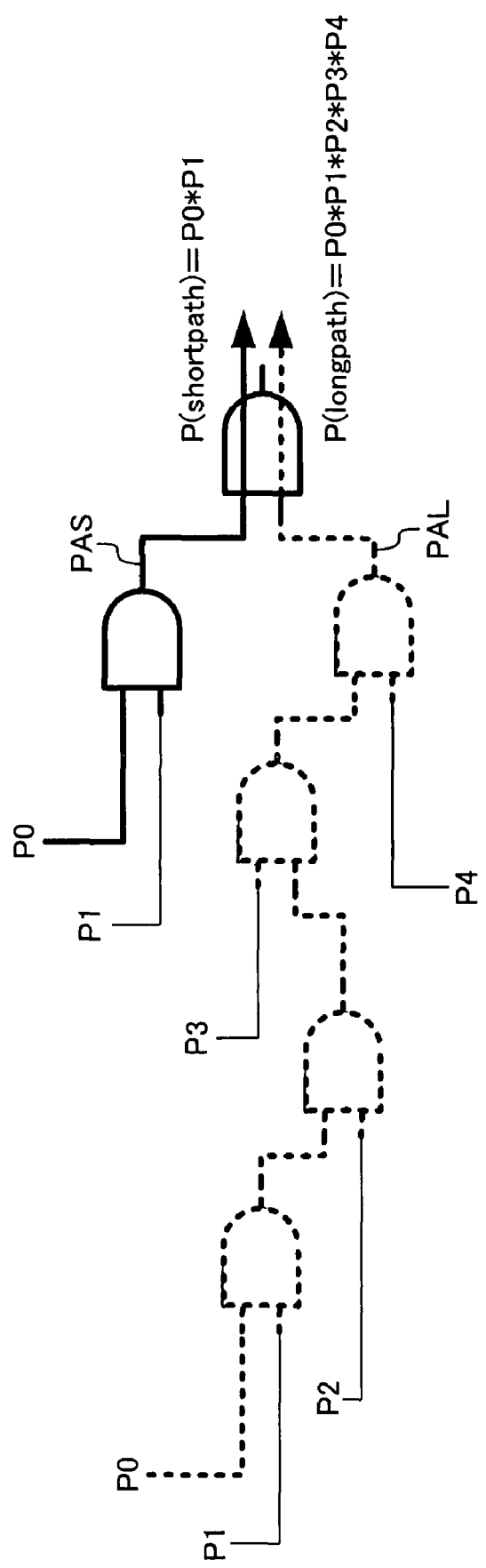
FIG. 17 is an illustrative view related to the activation of a path.

A description will be given to a specific example of the procedure (F9). FIG. 17 is an illustrative view of the activation ratio of each of the paths. Referring to FIG. 17, the background of the procedure which will be described herein below will be described.

In general, the activation ratio (the probability of a change in the value of a signal) of the output is obtained as the product of the respective activation ratios of the inputs. When the respective activation ratios of the input signals to the individual AND gates are P0, P1, P2, P3, and P4, the activation ratio P (shortpath) of the path PAS (indicated by the solid line in FIG. 17) with a small number of logic stages is given by:

$P(\text{shortpath}) = P0*P1,$ while the activation ratio P (longpath) of the path PAL (indicated by the broken line in FIG. 17) with a large number of logic stages is given by:

$P(\text{longpath}) = P0*P1*P2*P3*P4,$ wherein the activation ratio of a path is the activation ratio of the final-stage output of the path.

Because each of P0, P1, P2, P3, and P4 is not more than 1, the relationship given by:

$P(\text{shortpath}) \geq P(\text{longpath})$ is satisfied. In other words, it can be generally said that the activation ratio P (longpath) of the path with a long delay time (with a large number of logic stages) is lower than the activation ratio P (shortpath) of the path with a short delay time (with a small number of logic stages). Normally, the value of P (longpath) is relatively small.

Figure 18:
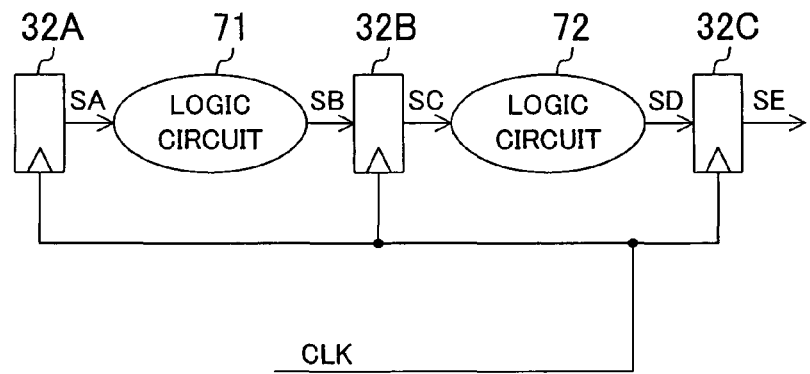
FIG. 18 is block diagram showing an example of a circuit using a normal register.

FIG. 18 is a block diagram showing an example of a circuit using normal registers. The circuit of FIG. 18 comprises registers 32A, 32B, and 32C and logic circuits 71 and 72. The logic circuit 71 has a path PT1 with a small delay and a path PT2 with a delay larger than the delay on the path PT1. The logic circuit 72 has a path PT3 with a delay smaller than the delay on the path PT2.

Figure 19:
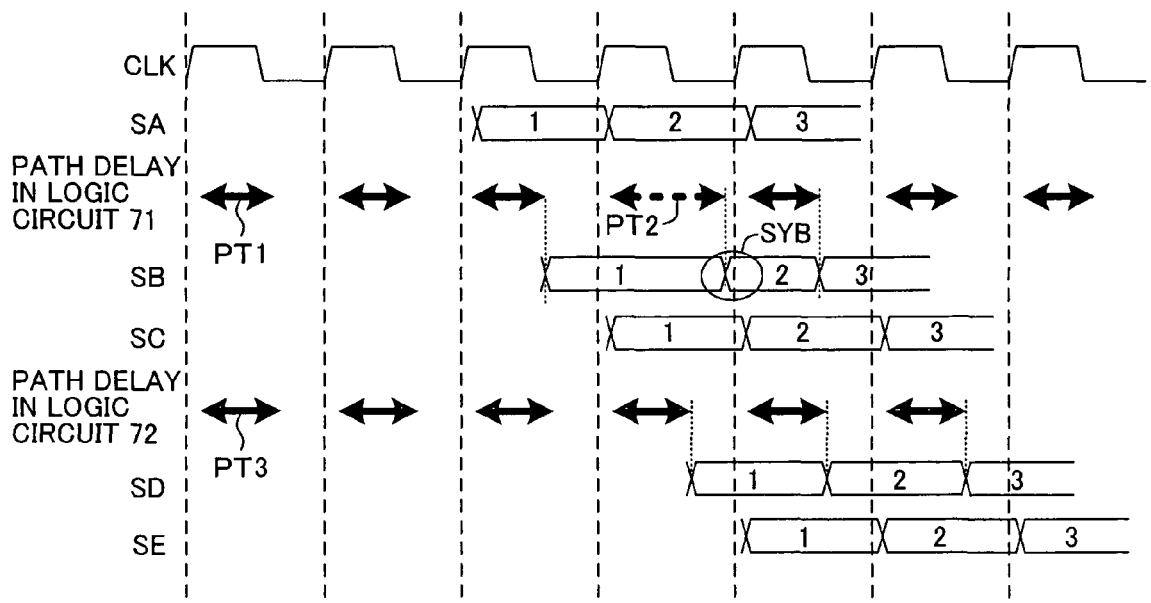
FIG. 19 is a timing chart for signals in the circuit of FIG. 18.

FIG. 19 is a timing chart for signals in the circuit of FIG. 18. To prevent the occurrence of a set-up error associated with an output signal SB from the path PT2 in the register 32B, it is necessary to provide the clock signal CLK with a longer period (see SYB in FIG. 19). Accordingly, the period of the clock signal CLK is set constantly longer than the delay on the path PT2 in the circuit of FIG. 18.

Figure 20:
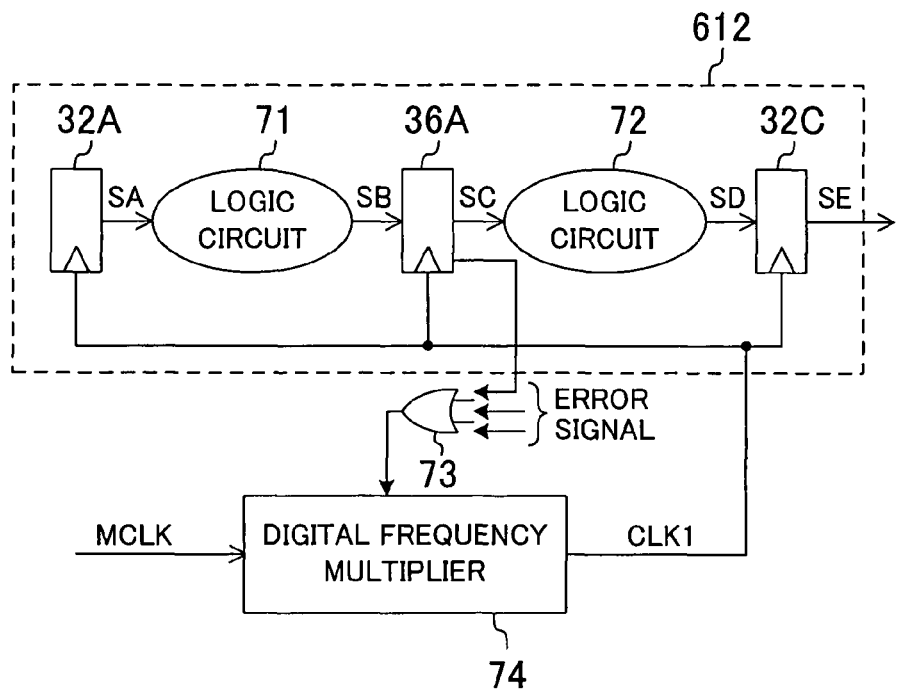
FIG. 20 is a block diagram showing an example of a circuit using the register of FIG. 6.

FIG. 20 is a block diagram showing an example of a circuit using the register of FIG. 6. The circuit of FIG. 20 comprises a semiconductor circuit 612, an OR gate 73, and a digital frequency multiplier 74. The circuit 612 is the same as the circuit of FIG. 18 of FIG. 6 except for including the register 36A in substitution for the register 32B. The semiconductor circuit 612 is an example of the semiconductor circuit 12. In FIG. 20, the OR gate 73 and the digital frequency multiplier 74 constitute an electrical characteristic control unit.

The digital frequency multiplier 74 generates a clock signal CLK1 based on a master clock signal MCLK and supplies the clock signal CLK1 to each of the registers 32A, 32C, and 36A. The period of the clock signal CLK1 is larger than the respective delays on the paths PT1 and PT3 and smaller than the delay on the path PT2.

Figure 21:
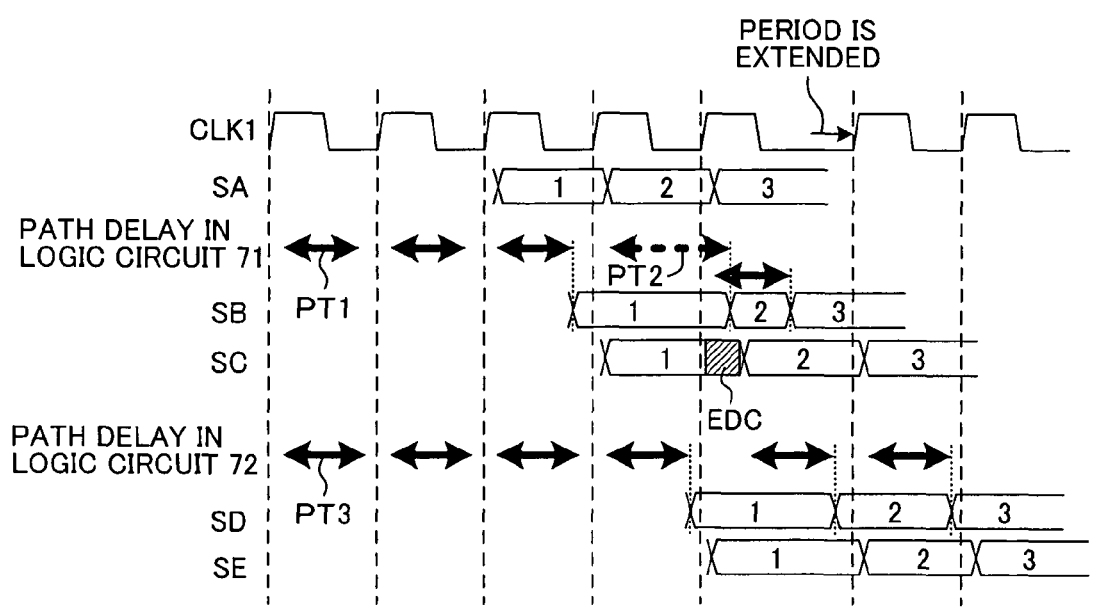
FIG. 21 is a timing chart for signals in the circuit of FIG. 20.

FIG. 21 is a timing chart for signals in the circuit of FIG. 20. When a set-up error occurs due to the delay on the path PT2, the register 36A detects the set-up error and outputs an error signal indicating that the error is detected to the OR gate 73. To the OR gate 73, an error signal other than the error signal from the register 36A is also inputted. When the error is detected, the OR gate 73 notifies the digital frequency multiplier 74 that the error is detected.

The register 36A detects a set-up error during a period DL (EDC in FIG. 21) from the edge timing of the clock signal CLK1 and produces an output with a normal value. When the error is detected, the digital frequency multiplier 74 extends the period of the clock signal CLK1 by the period DL. Thereafter, the digital frequency multiplier 74 returns the period of the clock signal CLK1 to a normal length. As a result, even when a set-up error is detected, the circuit of FIG. 20 can continue the circuit operation with no influence on the subsequent operation.

Thus, in the circuit of FIG. 20, the period of the clock signal is extended when a set-up error is detected. As a result, a clock signal at a high frequency can be used. In the case where the final-stage output of the path PT2 with a large delay time does not change, a set-up error is not detected and the period of the clock signal CLK1 is not extended. As has been described with reference to FIG. 17, the probability of a change in the final-stage output of the path PT2 with a large delay time is low so that the probability of the extension of the period of the clock signal CLK1 is low. Therefore, the average clock period in the circuit of FIG. 20 can be shortened compared with that in the circuit of FIG. 18.

Although the digital frequency multiplier 74 is used as means for modulating the clock frequency in FIG. 20, it is not limited thereto. Instead of the digital frequency multiplier 74, it is also possible to use, e.g., a quick-response PLL (phase locked loop) or the like.

Figure 22:
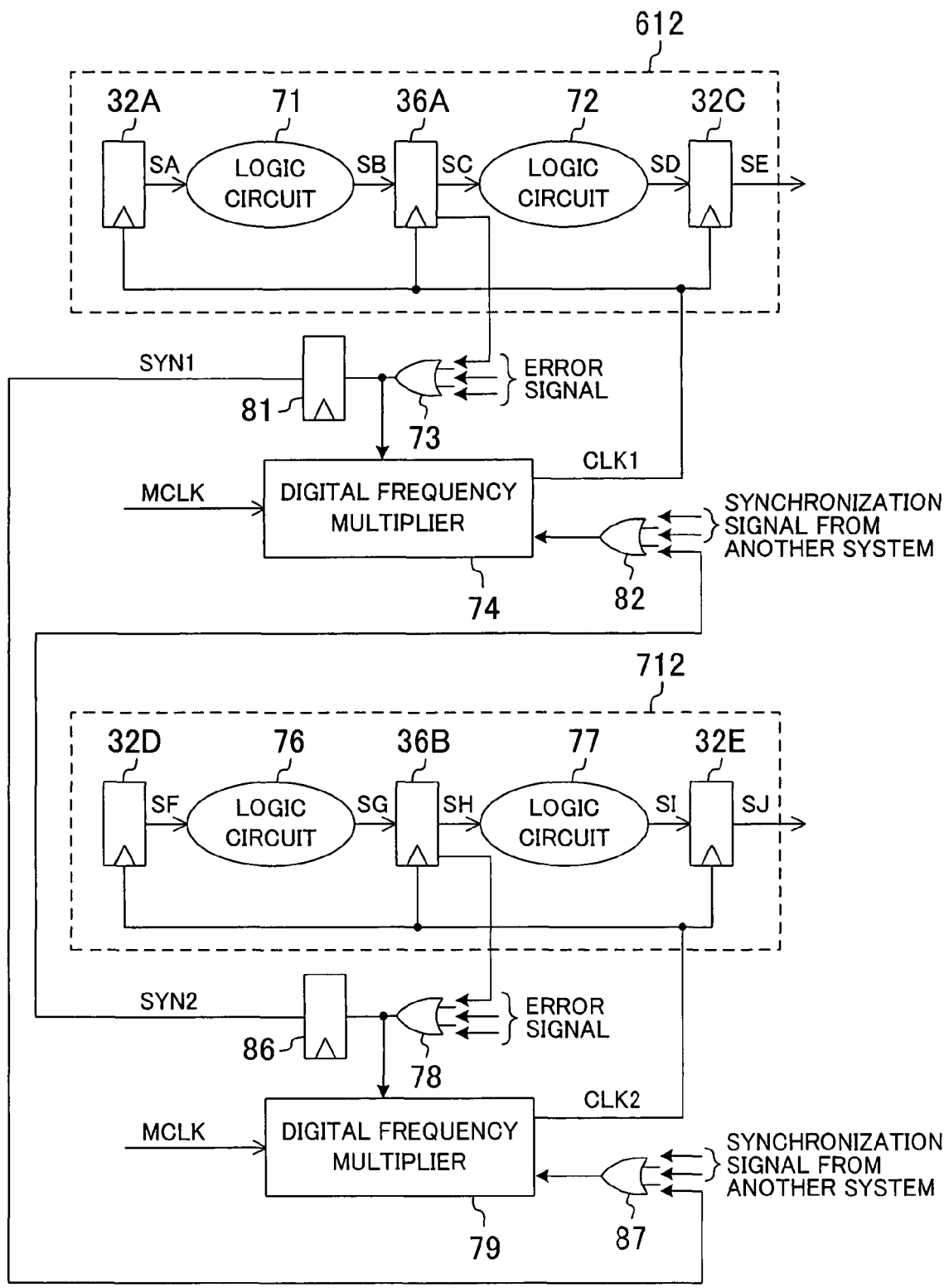
FIG. 22 is a block diagram of a variation of the circuit of FIG. 20.

FIG. 22 is a block diagram of a variation of the circuit of FIG. 20. The circuit of FIG. 22 further comprises a semiconductor circuit 712, OR gates 78, 82, and 87, a digital frequency multiplier 79, registers 81 and 86 in addition to the components of the circuit of FIG. 20. The semiconductor circuit 712 comprises registers 32D, 32E and 36B and logic circuits 76 and 77 and is constructed similarly to the semiconductor circuit 612 of FIG. 20. The register 36B has the set-up error detecting function, similarly to the register 36A.

The semiconductor circuits 612 and 712 are examples of the semiconductor circuit 12. The OR gates 73, 78, 82, and 87, the digital frequency multipliers 74 and 79, and the registers 81 and 86 constitute the electrical characteristic control unit.

Figure 23:
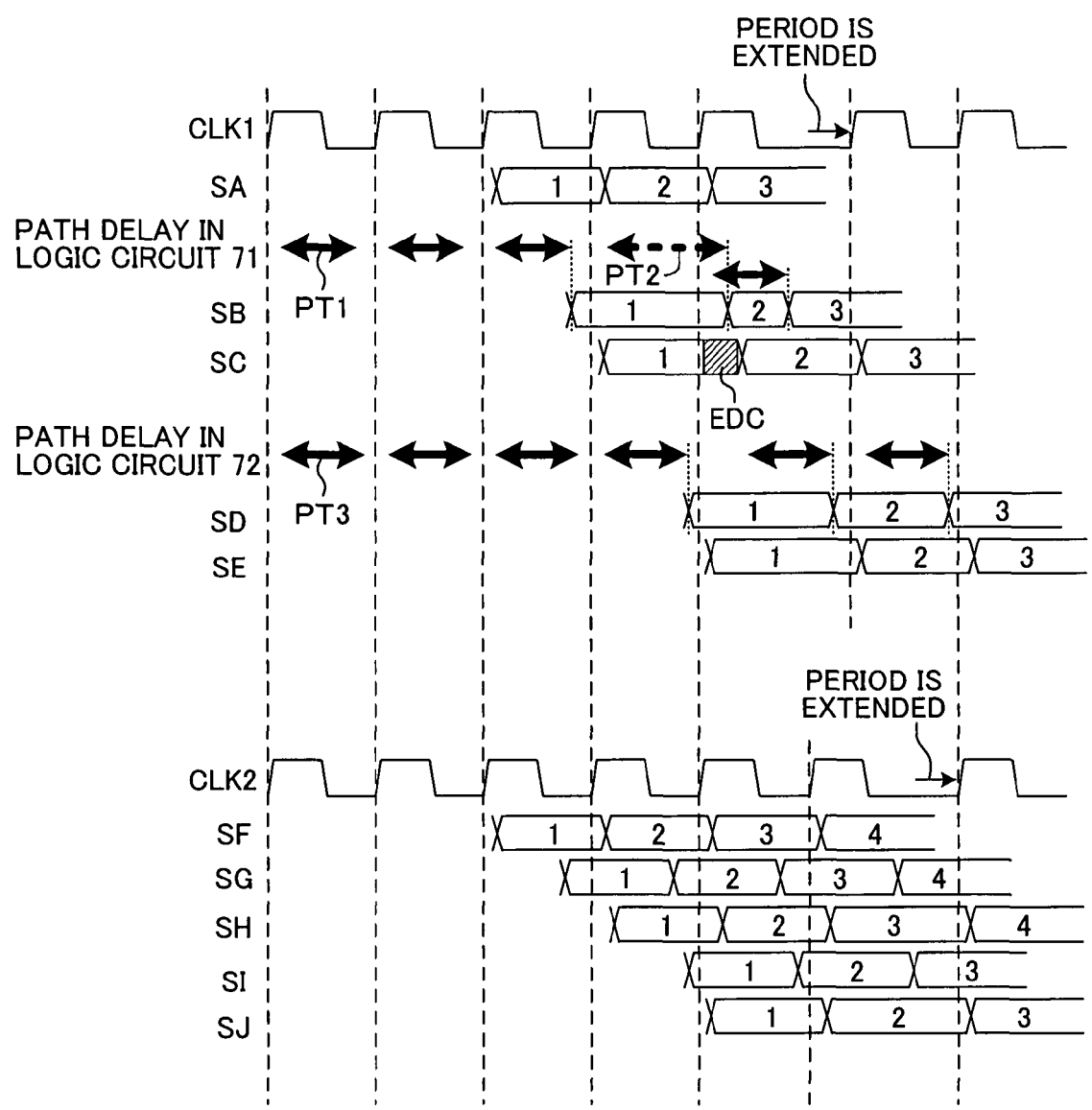
FIG. 23 is a timing chart for signals in the circuit of FIG. 20.

FIG. 23 is a timing chart for signals in the circuit of FIG. 22.

In general, clock control is critical in terms of a speed. When the detection of a set-up error is performed with a large number of registers, it is necessary to use the logical OR between the large number of error signals for clock signal control so that a delay in obtaining the logical OR presents a problem. Therefore, in the circuit of FIG. 22, the register 81 delays an output of the OR gate 73 by one cycle and outputs the delayed output as a synchronization signal SYN1 to the OR gate 87. The OR gate 87 obtains the logical OR between the synchronization signal SYN1 and a synchronization signal from another circuit and outputs the logical OR to the digital frequency multiplier 79.

When the synchronization signal is inputted from the OR gate 87, the digital frequency multiplier 79 extends the period of the clock signal CLK2 in the cycle subsequent to the cycle in which the digital frequency multiplier 74 has extended the period of the clock signal CLK1 as shown in, e.g., FIG. 23. As a result, the synchronization between the clock signal CLK1 and the clock signal CLK2 is maintained thereafter.

Likewise, the register 86 delays an output of the OR gate 78 by one cycle and outputs the delayed output as a synchronization signal SYN2 to the OR gate 82. The OR gate 82 obtains the logical OR between the synchronization signal SYN2 and a synchronization signal from another circuit and outputs the logical OR to the digital frequency multiplier 74. When the synchronization signal is inputted from the OR gate 82, the digital frequency multiplier 74 extends the period of the clock signal CLK1 in the cycle subsequent to the cycle in which the digital frequency multiplier 79 has extended the period of the clock signal CLK2.

Thus, in the circuit of FIG. 22, the structure of the OR gate 73 for obtaining the logical OR can be simplified and the delay in obtaining the logical OR can be reduced.

The circuits of FIGS. 20 and 22 can not only increase the clock frequencies but also implement the detection of a delay fault on the occurrence thereof and the outputting of a normal value.

A description will be given next to an application interface (API) between an OS and an application program. The API is a software layer linking the application program to the OS. To determine the normality/abnormality of a system from the behavior of the system, it is essential to obtain information for allowing the estimation of the system behavior with the API.

Figure 24:
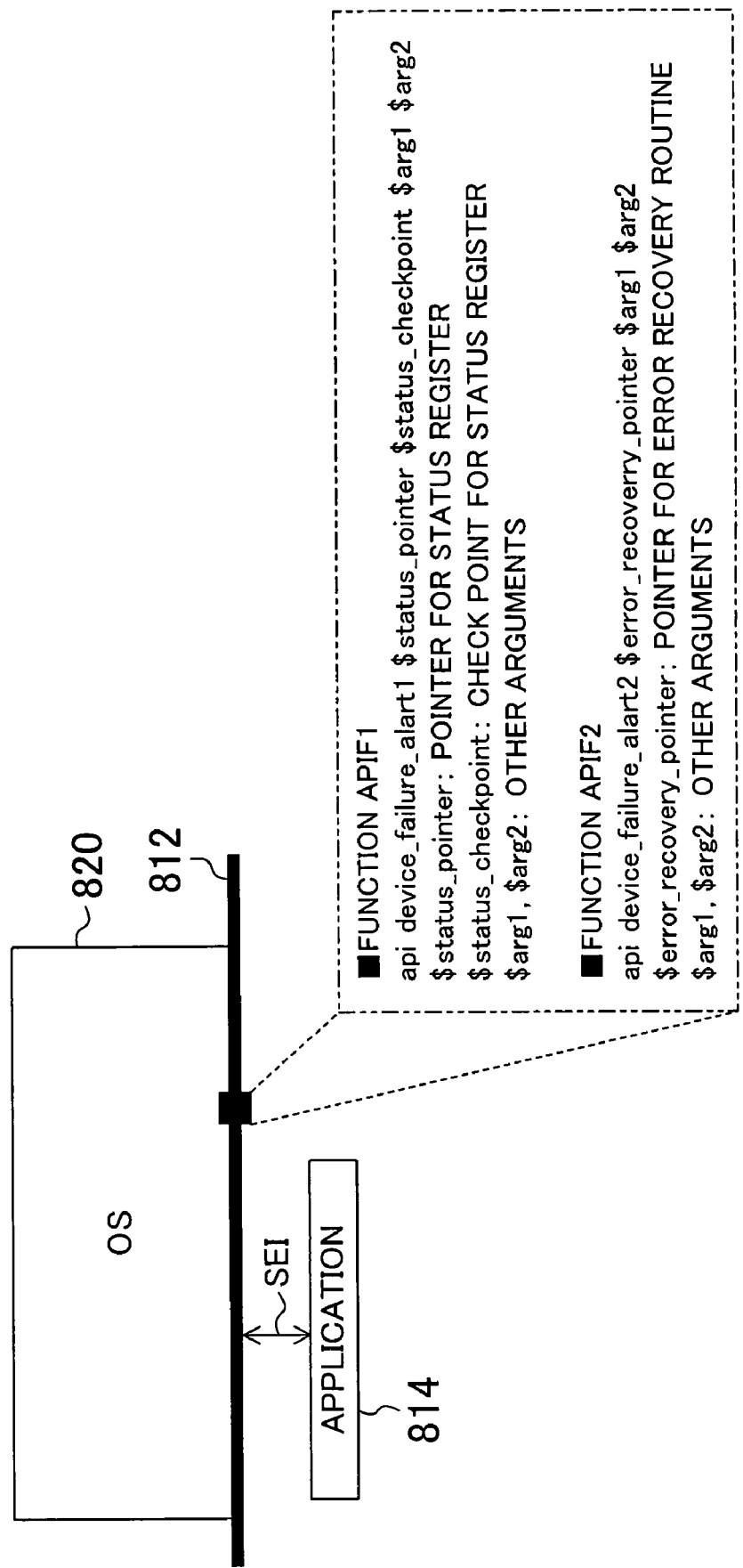
FIG. 24 is an illustrative view of an application interface.

FIG. 24 is an illustrative view of the application interface. An OS 820 is executed on, e.g., the LSI 20 of FIG. 1 and implements the function of the LSI 20. The OS 820 has an API 812 for notifying an application program 814 of information SEI for allowing the estimation of the system behavior between itself and the application program 814. In FIG. 24, functions APIF1 and APIF2 are shown as examples of the API 812. The information SEI indicates the state of execution of the application program 814 and is defined as an argument in the functions APIF1 and APIF2.

In the function APIF1, a pointer $status_pointer for identifying a status register and a checkpoint $status_checkpoint for the status register are defined each as the argument. The information sets allow the OS 820 to obtain identification information on the status register to be checked and a time at which the status register should be checked and thereby allow the normality/abnormality determination of the system to be implemented in accordance with, e.g., the foregoing procedure (C1).

In the function APIF2, a pointer $error_recovery_pointer for identifying an error recovery routine is defined as the argument. The information set allows the OS 820 to obtain identification information on the error recovery routine to be checked and thereby allows the normality/abnormality determination of the system to be implemented in accordance with the foregoing procedure (C2).

Although each of the foregoing embodiments has described the case where a MOS transistor is used, another type of transistor may also be used instead.

As described above, the present invention can remove an excessive margin for constantly implementing a normal operation and is therefore useful for, e.g., a semiconductor integrated circuit system of which a high-speed and low-power operation is required or the like.

What is claimed is:

1. A semiconductor integrated circuit system comprising:
   a control target circuit configured to execute a program;
   a system information monitor unit configured to output system information indicating a state of the control target circuit;
   a circuit characteristic monitor unit configured to determine a circuit characteristic of the control target circuit and outputting the circuit characteristic as circuit characteristic information;
   a malfunction determination unit configured to determine whether or not the control target circuit is normally operating based on the system information;
   a reference circuit characteristic holding unit configured to hold the circuit characteristic information as reference circuit characteristic information when the control target circuit is normally operating;
   a malfunction factor determination unit configured to determine a malfunction factor based on the circuit characteristic information determined by the circuit characteristic monitor unit and on the reference circuit characteristic information when the control target circuit is not normally operating;
   a correction target determination unit configured to determine a correction target in the control target circuit based on the malfunction factor, generating objective electrical characteristic information for the correction target, and outputting the objective electrical characteristic information; and
   an electrical characteristic control unit configured to control the control target circuit in accordance with the objective electrical characteristic information.

2. The semiconductor integrated circuit system of claim 1, wherein
   the system information monitor unit outputs the state of the control target circuit as the system information and
   the malfunction determination unit determines that the control target circuit is normally operating when the control target circuit at a predetermined time is in a predetermined state and determines that the control target circuit is not normally operating in the other cases.

3. The semiconductor integrated circuit of claim 1, wherein
   the system information monitor unit outputs information indicating that an error recovery routine in the program is called as the system information and
   the malfunction determination unit determines that the control target circuit is not normally operating when the error recovery routine is called a number of times not less than a predetermined number and determines that the control circuit is normally operating in the other cases.

4. The semiconductor integrated circuit system of claim 1, wherein
   the system information monitor unit outputs information indicating that an operating system has normally shut down as the system information and the malfunction determination unit determines that the control target circuit is not normally operating when the operating system has not normally shut down on an immediately previous shutdown and determines that the control target circuit is normally operating in the other cases.

5. The semiconductor integrated circuit system of claim 1, wherein
the system information monitor unit outputs information indicating that an error has occurred during execution of the program as the system information and
the malfunction determination unit determines that the control target circuit is not normally operating when the error has occurred and determines that the control target circuit is normally operating in the other cases.

6. The semiconductor integrated circuit system of claim 1, wherein the circuit characteristic monitor unit determines a magnitude of noise occurred on a predetermined wire in the control target circuit as the circuit characteristic.

7. The semiconductor integrated circuit system of claim 6, wherein the circuit characteristic monitor unit comprises:
a first n-type transistor having a gate to which a detection target signal as a signal on the predetermined wire is given, a source to which a first reference voltage is given, and a drain connected to a first dynamic node;
a first p-type transistor having a gate to which the detection target signal is given, a source to which a second reference voltage is given, and a drain connected to a second dynamic node;
a second p-type transistor having a source to which a power supply voltage is given and a drain connected to the first dynamic node, the second p-type transistor charging the first dynamic node in response to a reset signal;
a second n-type transistor having a source to which a ground voltage is given and a drain connected to the second dynamic node, the second n-type transistor discharging the second dynamic node in response to the reset signal;
a NOR circuit having, as an input, the first dynamic node and receiving a reference signal which is a signal on a portion of the predetermined wire closer to an element configured to drive the wire than a portion of the wire from which the detection target signal is given;
a NAND circuit having, as an input, the second dynamic node and receiving the reference signal;
a first latch set by an output of the NOR circuit;
a second latch set by an output of the NAND circuit, and
an OR circuit configured to output a logical OR between respective outputs of the first and second latches as a detection signal indicating that noise of a magnitude corresponding to the first or second reference voltage is detected.

8. The semiconductor integrated circuit system of claim 1, wherein the circuit characteristic monitor unit determines a slew time of a signal on a predetermined wire in the control target circuit as the circuit characteristic.

9. The semiconductor integrated circuit system of claim 8, wherein the circuit characteristic monitor unit comprises:
a first n-type transistor having a gate to which a detection target signal as a signal on the predetermined wire is given, a source to which a first reference voltage is given, and a drain connected to a first dynamic node;
a first p-type transistor having a gate to which the detection target signal is given, a source to which a second reference voltage is given, and a drain connected to a second dynamic node;
a second p-type transistor having a source to which a power supply voltage is given and a drain connected to the first dynamic node, the second p-type transistor charging the first dynamic node in response to a reset signal;
a second n-type transistor having a source to which a ground voltage is given and a drain connected to the second dynamic node, the second n-type transistor discharging the second dynamic node in response to the reset signal;
a first variable delay buffer configured to delay the detection target signal in response to a first delay control signal and outputting the delayed detection target signal;
a second variable delay buffer configured to delay the detection target signal in response to a second delay control signal and outputting the delayed detection target signal;
a NOR circuit having, as an input, the first dynamic node and receiving an output of the first variable delay buffer;
a NAND circuit having, as an input, the second dynamic node and receiving an output of the second variable delay buffer;
a first latch set by an output of the NOR circuit;
a second latch set by an output of the NAND circuit, and
an OR circuit configured to output a logical OR between respective outputs of the first and second latches as a detection signal indicating that a slew time of a magnitude corresponding to the delay in the first or second variable delay buffer is detected.

10. The semiconductor integrated circuit system of claim 1, wherein the circuit characteristic monitor unit determines a delay in a signal on a predetermined path in the control target circuit as the circuit characteristic.

11. The semiconductor integrated circuit system of claim 10, wherein the circuit characteristic monitor unit comprises:
a variable delay buffer configured to delay a signal at a starting point of the predetermined path in response to a delay control signal and outputting the delayed signal; and
a latch configured to latch a signal at an end point of the predetermined path in synchronization with the signal outputted from the variable delay buffer and outputting the latched signal as a detection signal indicating that a delay of a magnitude corresponding to the delay in the variable delay buffer is detected.

12. The semiconductor integrated circuit system of claim 1, wherein the circuit characteristic monitor unit determines a change in a signal based on an output of a predetermined holding circuit in the control target circuit as the circuit characteristic when a power supply voltage of the control target circuit decreases.

13. The semiconductor integrated circuit system of claim 12, wherein the circuit characteristic monitor unit comprises:
a latch configured to latch a detection target signal as the signal based on the output of the predetermined holding circuit in synchronization with a capture signal and outputting the latched signal; and
a comparison circuit configured to compare the detection target signal with the output of the latch and outputs a detection signal indicating a change in the detection target signal when the detection target signal is different from the output of the latch.

14. The semiconductor integrated circuit system of claim 1, wherein the circuit characteristic monitor unit determines a power supply voltage or temperature of the control target circuit as the circuit characteristic.

15. The semiconductor integrated circuit system of claim 1, wherein
- the system information monitor unit outputs data indicating a remaining power in a battery as the system information and,
- when the remaining power in the battery is low, the correction target determination unit generates the objective electrical characteristic information to implement correction for increasing a power supply voltage supplied to the control target circuit and reducing an operating frequency of the control target circuit.

16. The semiconductor integrated circuit system of claim 1, wherein the correction target determination unit generates the objective electrical characteristic information for temporarily increasing a power supply voltage supplied to the control target circuit, then periodically reducing the power supply voltage, and terminating correction for increasing the power supply voltage in a case where a malfunction does not occur when the power supply voltage is reduced.

17. The semiconductor integrated circuit system of claim 1, wherein
- the system information monitor unit outputs information on a temperature of the control target circuit as the system information and
- the correction target determination unit generates the objective electrical characteristic information to implement correction for increasing a power supply voltage supplied to the control target circuit and allowing a substrate bias of the control target circuit to provide a larger back bias or implement correction for reducing an operating frequency of the control target circuit.

18. The semiconductor integrated circuit system of claim 1, wherein the
- the system information monitor unit outputs an identification number of the control target circuit as the system information and
- the correction target determination unit estimates a fabrication time of the control target circuit from the system information and generates the objective electrical characteristic information for increasing a power supply voltage supplied to the control target circuit when a predetermined period has elapsed from the fabrication time.

19. The semiconductor integrated circuit system of claim 1, wherein
- the control target circuit comprises a plurality of drive transistors connected in parallel to drive a node and
- the electrical characteristic control unit controls the number of the drive transistors which drive the node out of the plurality of drive transistors when noise is the malfunction factor.

20. The semiconductor integrated circuit system of claim 1, wherein the electrical characteristic control unit controls a substrate voltage or power supply voltage of the correction target circuit as the correction target when noise is the malfunction factor.

21. The semiconductor integrated circuit system of claim 1, wherein the control target circuit has:
- a metal wire;
- a dummy metal disposed in proximity to the metal wire; and
- a ferroelectric material disposed over or under the dummy metal.

22. The semiconductor integrated circuit system of claim 1, wherein
- an operating system is operating as each of the system information monitor unit, the malfunction determination unit, the reference circuit characteristic holding unit, the malfunction factor determination unit, and the correction target determination unit,
- the operating system has a software layer for linking the program to the operating system, and
- the software layer is a function in which information indicating a state of execution of the program is defined as an argument.

23. The semiconductor integrated circuit system of claim 1, wherein
- the control target circuit comprises a register configured to detect a set-up error and outputting a result of the detection and
- the system information monitor unit outputs information indicating the detection result as the system information.

24. The semiconductor integrated circuit system of claim 23, wherein the register comprises:
- a first master latch configured to latch an inputted value; and
- a second master latch configured to latch the inputted value after the latching by the first master latch, wherein
- the register outputs a value at a node of the second master latch when a set-up error is detected.

25. The semiconductor integrated circuit system of claim 23, wherein the register comprises:
- a clock delay circuit configured to delay a clock signal and outputting an obtained delay clock signal;
- a first master latch configured to latch the inputted value in synchronization with the clock signal;
- a second master latch configured to latch the inputted value in synchronization with the delay clock signal;
- a slave latch configured to latch an output of the first master latch or the second master latch; and
- an error detection circuit configured to output, as the detection result, whether or not a value at a node of the first master latch coincides with a value at a node of the second master latch, wherein
- the first master latch outputs a value corresponding to the value at the node of the first master latch to the slave latch when the detection result shows that there is a coincidence therebetween and
- the second master latch outputs a value corresponding to the value at the node of the second master latch when the detection result shows that there is no coincidence therebetween.

26. The semiconductor integrated circuit system of claim 23, wherein
- the control target circuit executes a built-in self test,
- the correction target determination unit determines, as the objective electrical characteristic information, a range of a power supply voltage within which a set-up error is not detected in the control target circuit based on a result of the built-in self test, and
- the electrical characteristic control unit increases the power supply voltage to a value within the range when a set-up error is detected after the power supply voltage is reduced.

27. A semiconductor integrated circuit system comprising:
a control target circuit having a register; and
an electrical characteristic control unit configured to supply a clock signal to the control target circuit, wherein
the register detects a set-up error in the control target circuit and
the electrical characteristic control unit extends a period of the clock signal when the register detects a set-up error.

28. The semiconductor integrated circuit system of claim 27, wherein the electrical characteristic control unit extends, in a cycle subsequent to a cycle of the clock signal having the extended period, a period of another clock signal supplied to the control target circuit.

29. A control method for a semiconductor integrated circuit which controls a control target circuit in the semiconductor integrated circuit, the control method comprising:
- a malfunction determination step of determining whether or not the control target circuit is normally operating based on system information indicating a state of the control target circuit configured to execute a program;
- a reference circuit characteristic holding step of holding circuit characteristic information on the control target circuit as reference circuit characteristic information when the control target circuit is normally operating;
- a malfunction factor determination step of determining a malfunction factor based on circuit characteristic information on the control target circuit and on the reference circuit characteristic information when the control target circuit is not normally operating;
- a correction target determination step of determining a correction target in the control target circuit based on the malfunction factor; and
- a correction step of generating objective electrical characteristic information for the correction target.

30. A control method for a semiconductor integrated circuit which controls a control target circuit in the semiconductor integrated circuit, the control method comprising:
- a detection step of detecting a set-up error in the control target circuit; and
- a control step of extending a period of a clock signal supplied to the control target circuit when a set-up error is detected in the detection step.

* * * * *